US009678143B2

(12) United States Patent
Okada et al.

(10) Patent No.: US 9,678,143 B2
(45) Date of Patent: Jun. 13, 2017

(54) SEMICONDUCTOR EVALUATION APPARATUS

(71) Applicant: MITSUBISHI ELECTRIC CORPORATION, Tokyo (JP)

(72) Inventors: Akira Okada, Tokyo (JP); Takaya Noguchi, Tokyo (JP); Norihiro Takesako, Tokyo (JP); Kinya Yamashita, Tokyo (JP); Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 293 days.

(21) Appl. No.: 14/306,728

(22) Filed: Jun. 17, 2014

(65) Prior Publication Data

US 2015/0115989 A1 Apr. 30, 2015

(30) Foreign Application Priority Data

Oct. 31, 2013 (JP) ................................. 2013-226222

(51) Int. Cl.
*G01R 31/26* (2014.01)
*G01R 31/28* (2006.01)
(Continued)

(52) U.S. Cl.
CPC ........... *G01R 31/2808* (2013.01); *G01R 1/18* (2013.01); *G01R 1/06777* (2013.01); *G01R 1/07314* (2013.01); *G01R 1/07371* (2013.01)

(58) Field of Classification Search
CPC ............ G01R 31/2808; G01R 31/2886; G01R 31/2887; G01R 31/2889; G01R 1/18;
(Continued)

(56) References Cited

U.S. PATENT DOCUMENTS 6,924,656 B2 * 8/2005 Matsumoto ............ G01R 31/01
324/750.19
2003/0237061 A1 * 12/2003 Miller ................ G01R 31/2886
438/18
(Continued)

FOREIGN PATENT DOCUMENTS

CN 101183566 A 5/2008
CN 102313864 A 1/2012
(Continued)

OTHER PUBLICATIONS

An Office Action; "Notice of Grounds of Rejection," issued by the Japanese Patent Office on Nov. 22, 2016, which corresponds to Japanese Patent Application No. 2013-226222 and is related to U.S. Appl. No. 14/306,728; with English language partial translation.
(Continued)

*Primary Examiner* — Tung X Nguyen
*Assistant Examiner* — Lee Rodak
(74) *Attorney, Agent, or Firm* — Studebaker & Brackett PC

(57) ABSTRACT

A semiconductor evaluation apparatus includes a jig for evaluation and a probe substrate. The jig for evaluation is provided such that a plurality of semiconductor devices can be placed thereon. The probe substrate is provided so as to face the jig for evaluation, and includes a contact probe. The jig for evaluation includes a plurality of housing portions divided by a frame portion such that the plurality of semiconductor devices can be separately placed on the plurality of housing portions, respectively. The semiconductor evaluation apparatus is configured such that the contact probe can be brought into contact with a plurality of elements in the state where a space is provided by bringing the frame portion and the probe substrate in proximity to each other. In this space, each of the plurality of semiconductor devices is
(Continued)

placed between a corresponding one of the plurality of housing portions and the probe substrate.

11 Claims, 14 Drawing Sheets

(51) Int. Cl.
*G01R 1/18* (2006.01)
*G01R 1/067* (2006.01)
*G01R 1/073* (2006.01)

(58) Field of Classification Search
CPC ............ G01R 1/06777; G01R 1/07314; G01R 1/07371; G01R 1/045; G01R 1/0458; G01R 1/0483; G01R 1/067; G01R 1/06705; G01R 1/06711; G01R 1/06722; G01R 1/06772; G01R 1/06794; G01R 1/07; G01R 1/07342; G01R 1/0735; G01R 1/07385; G01R 1/0408; G01R 1/0466; G01R 1/01; G01R 1/0491; G01R 31/16; G01R 31/2891; G01R 31/2893; G01R 31/129; G01R 31/26; G01R 31/2601; G01R 31/2831; G01R 31/31905; G01R 31/2879; G01R 1/04; G01R 1/16; G01R 1/2608; G01R 1/2642; G01R 1/2808; G01R 1/2831; G01R 1/286; G01R 1/2862; G01R 1/2863; G01R 1/2879; G01R 1/2898; G01R 1/3025; G01R 1/2886; G01R 1/2893; G01R 1/2601; G01R 1/31905; G01R 1/129; G01R 1/2851; G01R 1/2887; G01R 1/2889; G01R 1/2891
USPC ........................................ 324/750.01–765.01
See application file for complete search history.

(56) References Cited

U.S. PATENT DOCUMENTS

| | | | |
|---|---|---|---|
| 2004/0085060 A1 | 5/2004 | Matsumoto | |
| 2007/0063721 A1* | 3/2007 | Dozier | G01R 31/2889 324/750.14 |
| 2008/0116926 A1 | 5/2008 | Ko et al. | |
| 2009/0224785 A1* | 9/2009 | Breinlinger | G01R 1/06772 324/756.01 |
| 2011/0309850 A1 | 12/2011 | Yoshida et al. | |
| 2013/0093453 A1* | 4/2013 | Sakata | G01R 31/2887 324/756.03 |
| 2014/0002118 A1* | 1/2014 | Gaggl | G01R 31/2642 324/750.01 |
| 2014/0028338 A1* | 1/2014 | Kuo | G01R 1/06711 324/750.26 |
| 2015/0015285 A1* | 1/2015 | Shinohara | G01R 1/0491 324/750.19 |
| 2015/0130489 A1* | 5/2015 | Yamada | G01R 31/2887 324/754.11 |

FOREIGN PATENT DOCUMENTS

| | | |
|---|---|---|
| CN | 203204030 U | 9/2013 |
| JP | H10-096746 A | 4/1998 |
| JP | 11-271387 A | 8/1999 |
| JP | 2003-130889 A | 5/2003 |
| JP | 2005-530178 A | 10/2005 |
| JP | 2010-010306 A | 1/2010 |
| JP | 2011-252792 A | 12/2011 |
| JP | 2012-191083 A | 10/2012 |
| JP | 2013-053898 A | 3/2013 |
| WO | 2012/086653 A1 | 6/2012 |

OTHER PUBLICATIONS

CN Office Action dated Dec. 26, 2016 from corresponding CN Appl No. 201410475450.6, with English translation, 12 pp.

* cited by examiner

SEMICONDUCTOR EVALUATION APPARATUS

BACKGROUND OF THE INVENTION

Field of the Invention

The present invention relates to a semiconductor evaluation apparatus and particularly to a semiconductor evaluation apparatus having a contact probe.

Description of the Background Art

For example, when measuring (evaluating) electrical characteristics of an element formed on a semiconductor device such as a semiconductor wafer and a semiconductor chip, for example, a mounting surface of the semiconductor device as an object to be measured is brought into contact with the surface of a chuck stage and fixed thereto by means of vacuum adsorption or the like. Then, a contact probe used for inputting and outputting an electrical signal for measuring the electrical characteristics is brought into contact with a desired portion on the surface of the semiconductor device as an object to be measured. Conventionally, a multi-pin contact probe has been developed according to demand and the like for allowing application of a large current and a large voltage to the contact probe.

Under such circumstances, it is known that, due to application of a large electrical signal such as a large current and development of a multi-pin contact probe, a phenomenon called partial discharge occurs, for example, between the contact probe and the object to be measured during evaluation of the object to be measured, thereby causing a partial damage to the object to be measured and defects associated therewith. It is important to suppress such partial discharge. If generated partial discharge is overlooked and an object to be measured undergoing partial discharge goes to a post-process as a non-defective product, it is extremely difficult in the post-process to extract such an object to be measured undergoing partial discharge. Accordingly, it is preferable to take measures to suppress partial discharge in advance. The semiconductor evaluation apparatus and the semiconductor evaluation method for suppressing partial discharge are, for example, disclosed in each of the following patent documents.

According to a semiconductor test jig in Japanese Patent Laying-Open No. 2013-53898, measurement is carried out without placing a semiconductor device as an object to be measured in a (for example, sealed) space. Accordingly, no preparation is made for the environment where an object to be measured is to be placed, for more reliably suppressing partial discharge.

According to a test apparatus in Japanese Patent Laying-Open No. 2003-130889, an insulating liquid is supplied into a (for example, sealed) space in the state where an object to be tested is placed in this space, thereby allowing more reliable suppression of occurrence of partial discharge during measurement of the characteristics of the element formed in the object to be tested. However, an expensive probe substrate is required for implementing such a function. Also, in Japanese Patent Laying-Open No. 2003-130889, measurement is carried out while supplying a liquid to an object to be tested. Accordingly, when the object to be tested is for example an element formed on a semiconductor wafer, a semiconductor chip or the like, it becomes necessary to carry out an extra process after completion of the measurement for completely removing, from the object to be tested, an insulating liquid supplied to the object to be tested. Since such an extra process is required, the method disclosed in Japanese Patent Laying-Open No. 2003-130889 causes an increase in time required for the process of evaluating the object to be tested, thereby causing a problem that cost reduction cannot be achieved.

In Japanese Patent Laying-Open No. 10-96746, inert gas is supplied into a (for example, sealed) space in the state where an object to be tested is placed within this space, thereby allowing more reliable suppression of occurrence of partial discharge during measurement of the characteristics of the element formed in the object to be tested. Furthermore, in Japanese Patent Laying-Open No. 2011-252792, the space is pressurized in the state where the object to be tested is placed within this space, thereby allowing more reliable suppression of occurrence of partial discharge during measurement of the characteristics of the element formed in the object to be tested. In each case described above, however, the apparatus configuration becomes complicated, so that cost reduction for the apparatus may not be achieved. Furthermore, in each case described above, the time required for the process of evaluating the object to be tested is increased, thereby causing a problem that cost reduction cannot be achieved.

The present invention has been made in light of the above-described problems. An object of the present invention is to provide a semiconductor evaluation apparatus and a semiconductor evaluation method, by which partial discharge that may occur during element measurement can be more reliably suppressed with more efficiency.

SUMMARY OF THE INVENTION

A semiconductor evaluation apparatus of the present invention uses a contact probe to measure electrical characteristics of an element formed in each of a plurality of semiconductor devices. The semiconductor evaluation apparatus includes a jig for evaluation and a probe substrate. The jig for evaluation is provided such that the plurality of semiconductor devices can be placed thereon. The probe substrate is provided so as to face the jig for evaluation, and includes the contact probe, a shield portion capable of shielding the element against an electric field produced by a current flowing through the contact probe, and an insulating substrate holding the contact probe. The jig for evaluation includes a plurality of housing portions divided by a frame portion such that the plurality of semiconductor devices can be separately placed on the plurality of housing portions, respectively. The semiconductor evaluation apparatus is configured such that the contact probe can be brought into contact with the element in a state where a space is provided by bringing the frame portion and the probe substrate in proximity to each other. In this space, the plurality of semiconductor devices each are placed between the probe substrate and a corresponding one of the plurality of housing portions.

A semiconductor evaluation method of the present invention includes the following steps.

First prepared is a jig for evaluation configured such that a plurality of semiconductor devices can be placed thereon. The plurality of semiconductor devices are separately placed on a plurality of housing portions, respectively, divided by a frame portion included in the jig for evaluation. The electrical characteristics of the element formed in each of the plurality of semiconductor devices within the plurality of housing portions are measured in the state where a space is provided between each of the plurality of housing portions and the probe substrate by bringing the probe substrate facing the jig for evaluation and the frame portion in proximity to each other.

According to a semiconductor evaluation apparatus of the present invention, measurement is carried out in the state where each of a plurality of semiconductor devices is placed within a space provided between a corresponding one of housing portions divided by a frame portion and a probe substrate. The probe substrate includes a shield portion and an insulating substrate. Accordingly, the plurality of semiconductor devices are placed at a time, thereby more efficiently measuring the electrical characteristics of the element using a contact probe for the plurality of semiconductor devices, and allowing suppression of occurrence of partial discharge resulting from a current flowing during measurement of the electrical characteristics.

According to a semiconductor evaluation method of the present invention, measurement is carried out in the state where each of a plurality of semiconductor devices is placed within a space provided between a corresponding one of housing portions divided by a frame portion and a probe substrate. A fluid is sprayed onto the surface of the semiconductor device, that is, into the space. Accordingly, the plurality of semiconductor devices are placed at a time, thereby more efficiently measuring the electrical characteristics of the element using a contact probe for the plurality of semiconductor devices, and allowing suppression of occurrence of partial discharge resulting from a current flowing during measurement of the electrical characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the accompanying drawings.

First Embodiment

As a configuration of a semiconductor evaluation apparatus of the present embodiment, the configuration of a measurement apparatus will be described with reference to FIGS. 1 to 9. For the purpose of illustration, an X direction, a Y direction and a Z direction are introduced.

In the following description, a measurement apparatus 100 will be described based on the premise that this measurement apparatus 100 is basically used for measuring electrical characteristics of an element as a so-called vertical semiconductor element that is formed in a semiconductor chip 10 described below and configured such that a large current flows therethrough in the up-down direction in FIG. 1. However, measurement apparatus 100 in the present embodiment is not limited to such a configuration, but may be used for measuring the electrical characteristics of semiconductor chip 10 provided with a so-called horizontal semiconductor element, through which a current flows in the right-left direction in FIG. 1.

Figure 1:
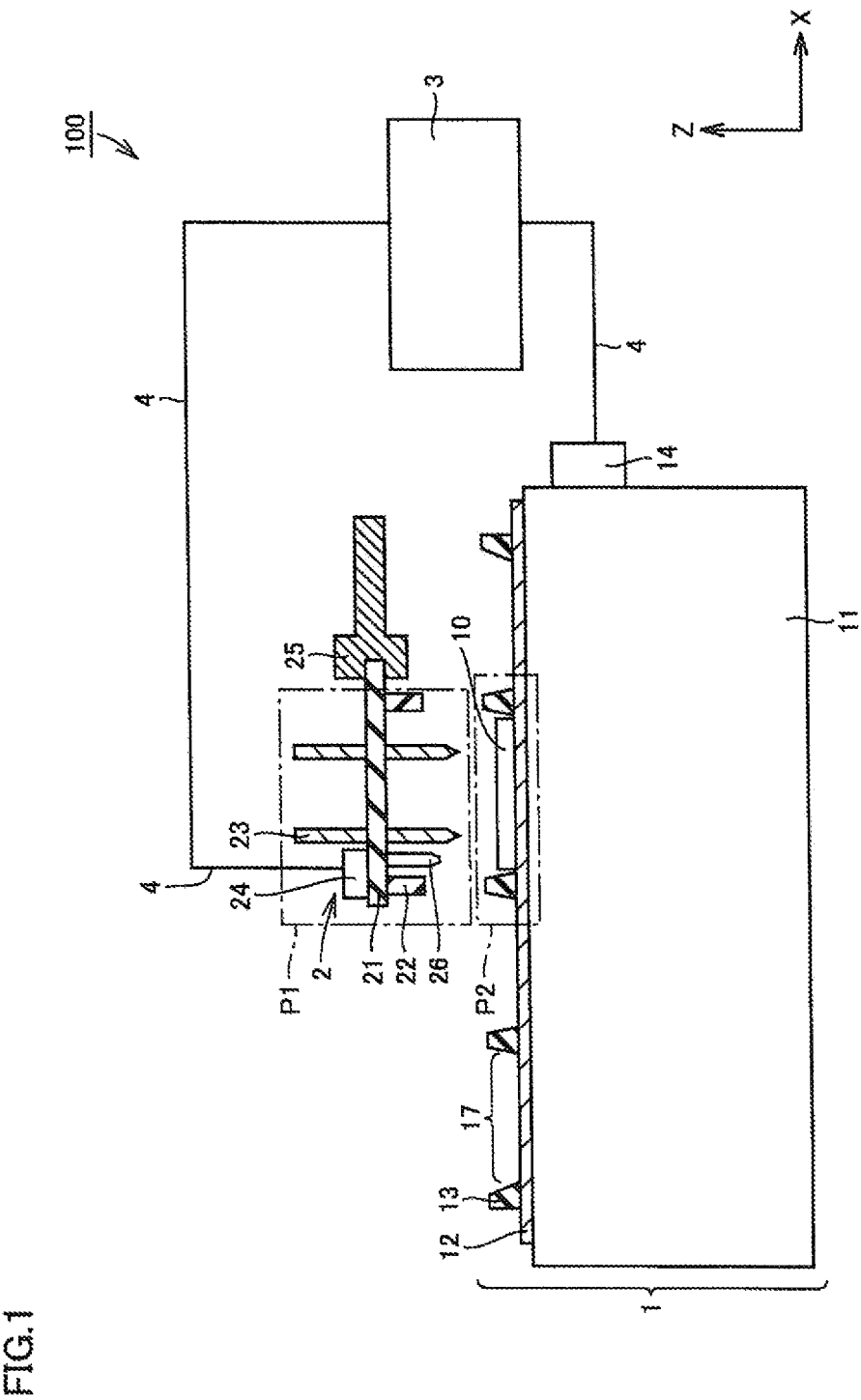
FIG. 1 is a schematic cross-sectional view of a semiconductor evaluation apparatus in the first embodiment of the present invention.

Referring to FIG. 1, measurement apparatus 100 according to the present embodiment is a semiconductor evaluation apparatus using a contact probe 23 described later to measure the electrical characteristics of an element (for example, a vertical semiconductor element) formed in each of a plurality of semiconductor chips 10 described later. Measurement apparatus 100 mainly includes a support substrate 1, a probe substrate 2, an evaluation unit 3, and a signal line 4.

Support substrate 1 is a member on which a semiconductor device can be placed and supported thereon. In this semiconductor device, an element as an object to be measured (a vertical semiconductor element and the like) is formed. The semiconductor device is a semiconductor chip 10 made of a silicon substrate produced, for example, by dicing a silicon wafer. Probe substrate 2 includes a contact probe that can be brought into contact with and placed on the element formed in semiconductor chip 10 for measuring the electrical characteristics of this element. This probe substrate 2 also provides a region to which a current and a voltage used for measuring the electrical characteristics of the element can be applied. Evaluation unit 3 serves as a device capable of measuring and controlling the current and the voltage in the region extending from probe substrate 2 to the object to be measured (semiconductor chip). Furthermore, signal line 4 is a passage of an electrical signal between support substrate 1 and evaluation unit 3, and between probe substrate 2 and evaluation unit 3.

Support substrate 1 includes a chuck stage 11 and a semiconductor test jig 12 as a jig for evaluation. A frame portion 13 is formed on semiconductor test jig 12. Furthermore, a connection portion 14 for connecting chuck stage 11 and signal line 4 is provided, for example, on the side surface of chuck stage 11.

Semiconductor test jig 12 is placed on the upper surface of chuck stage 11. Semiconductor test jig 12 is configured such that semiconductor chip 10 can be placed within each of a plurality of housing portions 17 consisting of separate regions divided by frame portion 13.

Chuck stage 11 is a base having an upper surface to which semiconductor test jig 12 is fixed in contact therewith. On this semiconductor test jig 12, semiconductor chip 10 having for example a plurality of vertical semiconductor elements formed therein is placed. Semiconductor test jig 12 may be adsorbed onto the upper surface of chuck stage 11 for example by means of vacuum, and thereby fixed on the upper surface of chuck stage 11 in contact therewith.

It is to be noted that the method of fixing semiconductor test jig 12 to the upper surface of chuck stage 11 in contact therewith is not limited to adsorption by means of vacuum as described above, but for example may be implemented by electrostatic adsorption or by fitting semiconductor test jig 12 in chuck stage 11.

Figure 2:
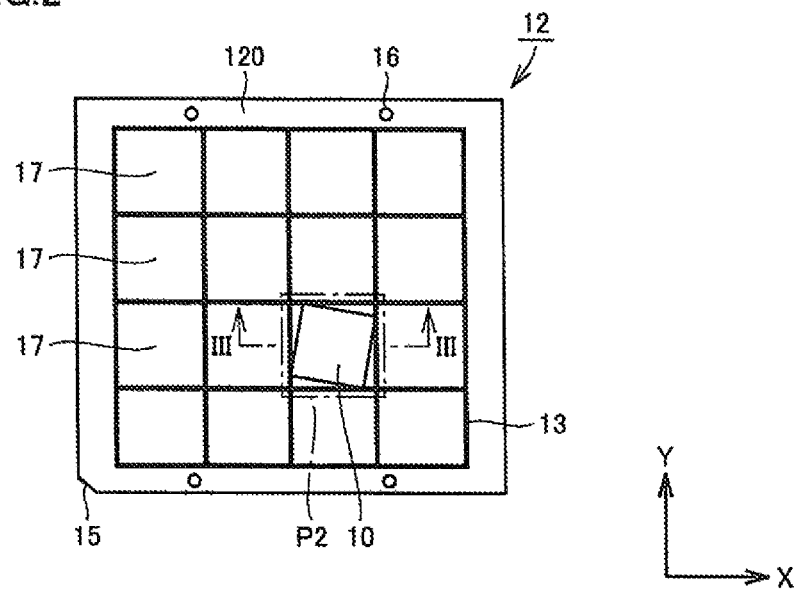
FIG. 2 is a schematic plan view showing the states of a semiconductor test jig shown in FIG. 1 and a semiconductor chip placed on the semiconductor test jig.

For specific description, referring to FIG. 2, semiconductor test jig 12 is formed such that a pedestal 120 is used as a base body. Pedestal 120 has a rectangular plane shape, for example.

Furthermore, semiconductor test jig 12 has first positioning means 15 and second positioning means 16. By first positioning means 15 and second positioning means 16, the position of semiconductor chip 10 placed on semiconductor test jig 12 is determined with respect to the test apparatus (not shown) incorporated in measurement apparatus 100 and measuring electrical characteristics. First positioning means 15 is formed of an inclined side portion provided at one corner of pedestal 120. The up-down direction and the right-left direction of semiconductor test jig 12 may be determined by first positioning means 15. Second positioning means 16 is formed of a plurality of holes provided in one side of pedestal 120 and in the other side opposite to this one side. Semiconductor test jig 12 is positioned by fitting the plurality of holes of second positioning means 16 on protrusions, respectively, provided on the upper surface of chuck stage 11 onto which semiconductor test jig 12 is fixed.

Pedestal 120 may have conductivity. Accordingly, semiconductor chip 10 provided with a semiconductor element having a vertical structure may be evaluated using pedestal 120 as an electrode. Pedestal 120 is made for example of metal, and may be made of plate-shaped aluminum as a specific example. It is to be noted that pedestal 120 does not need to have conductivity in evaluation of semiconductor chip 10 provided with a horizontally-structured semiconductor element having an electrode pad formed only on its surface.

Although only one semiconductor chip 10 is shown in FIG. 2 for ease of illustration, pedestal 120 is provided such that a plurality of semiconductor chips 10 can be placed thereon. In the present embodiment, pedestal 120 is configured such that sixteen semiconductor chips 10 can be placed thereon, by way of example.

Frame portion 13 is disposed on pedestal 120 so as to face the side surface of semiconductor chip 10. Frame portion 13 is configured in a protruded shape and in a grid pattern as seen in plan view. In the present embodiment, frame portion 13 is made of a resin material such as PPS (Poly Phenylene Sulfide Resin), for example, that is an insulating material, for the purpose of electrically insulating between semiconductor chips 10 divided by this frame portion 13.

Frame portion 13 is provided so as to surround the side surface of semiconductor chip 10. Frame portion 13 surrounds each of the plurality of semiconductor chips 10 separately, thereby dividing pedestal 120 into a plurality of housing portions 17 such that the plurality of semiconductor chips 10 can be separately placed on these housing portions 17, respectively. In other words, the plurality of semiconductor chips 10 placed on placed on semiconductor test jig 12 are not brought into contact with each other, but separately housed in housing portions 17, respectively. In order to prevent damages such as a scratch to the surface on the backside of semiconductor chip 10 placed on each of housing portions 17, it is preferable that housing portions 17 are subjected to a washing process and a polishing process such that these housing portions 17 become more flat and burrs and protrusions are removed from these housing portions 17.

It is to be noted that frame portion 13 may be inclined so as to have a width increased in the direction toward pedestal 120. In this way, frame portion 13 serves as a guide when semiconductor chips 10 are placed on housing portions 17, with the result that semiconductor chips 10 can be smoothly placed on housing portions 17 without semiconductor chips 10 interfering with frame portion 13.

Although semiconductor test jig 12 is configured so as to allow sixteen semiconductor chips 10 to be placed thereon in the present embodiment, the configuration is not limited thereto, but the number of semiconductor chips 10 to be placed may be increased or decreased in accordance with the size of the test apparatus and the size of the semiconductor device. Furthermore, semiconductor test jig 12 can also be used for conveying semiconductor chip 10.

Again referring to FIG. 1, probe substrate 2 is provided so as to face support substrate 1, and particularly provided so as to face semiconductor test jig 12. Accordingly, probe substrate 2 is disposed particularly directly above semiconductor test jig 12 of support substrate 1 and placed at a distance from semiconductor test jig 12, for example. Probe substrate 2 mainly includes an insulating substrate 21 made of an insulator, a shield portion 22 and contact probe 23. Furthermore, a connection portion 24 for connecting insulating substrate 21 and signal line 4 is formed, for example, on the upper surface of insulating substrate 21. Probe substrate 2 in FIG. 1 is further equipped with a moving arm 25 and fluid spraying means 26.

Insulating substrate 21 is sized to face a part of the region on the surface of semiconductor test jig 12, and for example, formed to have a size that can overlap with a single housing portion 17 as seen in plan view, which is formed by the surrounding frame portions 13 extending so as to be adjacent to each other (see FIG. 2). Insulating substrate 21 is made of an insulating material in order to improve the effect of suppressing partial discharge during measurement of semiconductor chip 10.

When measuring each of the plurality of semiconductor chips 10 placed on semiconductor test jig 12, shield portion 22 surrounds each of these semiconductor chips 10, so that the semiconductor element can be shielded against an electric field generated by the current flowing into each semiconductor chip 10 through contact probe 23 during measurement. In other words, partial discharge caused by the electric field during measurement of semiconductor chip 10 is suppressed by shield portion 22. It is preferable that shield portion 22 is made of a resin material such as PPS (Poly Phenylene Sulfide Resin), for example.

When evaluating the electrical characteristics of the vertical semiconductor element in semiconductor chip 10, one electrode (a so-called surface electrode) of a pair of electrodes for electrically connecting the vertical semiconductor element to the outside is contact probe 23 forming a vertical semiconductor element and brought into contact with an electrode pad described later. Furthermore, the other electrode (a so-called backside electrode) of the pair of electrodes corresponds to the upper surface of chuck stage 11 coming in contact with the lower surface of semiconductor test jig 12 on which semiconductor chip 10 having a vertical semiconductor element formed therein is placed.

In other words, in FIG. 1, insulating substrate 21 is connected to contact probe 23 so as to hold contact probe 23. Specifically, contact probe 23 is disposed to extend in the up-down direction in the figure so as to extend through a hole portion (not shown) provided in insulating substrate 21 from one main surface (for example, on the upper side) of insulating substrate 21 to the other main surface (for example, on the lower side) thereof. Then, this contact probe 23 is held by insulating substrate 21. During measurement of the electrical characteristics of the element of semiconductor chip 10, contact probe 23 functions to cause a current to flow through the element and detect the current that has flowed.

The electrical signal of the surface electrode transmitted through contact probe 23 is electrically connected to evaluation unit 3 through signal line 4 connected to contact probe 23 (insulating substrate 21) via connection portion 24. On the other hand, the electrical signal of the backside electrode transmitted on the upper surface of chuck stage 11 is electrically connected to evaluation unit 3 through signal line 4 electrically connected to chuck stage 11 through connection portion 14 provided on the side surface of chuck stage 11.

It is preferable that a plurality of contact probes 23 are provided. Although two contact probes are provided in FIG. 1 by way of example, the number of contact probes to be provided is not limited thereto. This is for allowing a large current to flow into a plurality of divided flow paths, assuming that such a large current flows through contact probe 23 (that is, a vertical semiconductor element) during measurement of the electrical characteristics.

It is preferable that connection portion 24 and connection portion 14 are provided such that the length of the passage from connection portion 24 through contact probe 23 to connection portion 14 is approximately the same even when this passage extends through any one of the plurality of contact probes 23. Accordingly, in FIG. 1, connection portion 24 can also be disposed at the end (left-side end or the like) on the surface of insulating substrate 21 in FIG. 1 by way of example. In this way, the length of the passage of the current flowing through each contact probe 23 can be approximately the same, thereby allowing more reliable measurement. However, for example, if the length of the above-described passage can be the same between a plurality of contact probes 23 by adjusting the layout of a metal interconnection (not shown) for example formed in insulating substrate 21 and electrically connecting contact probe 23 and connection portion 24 to each other, connection portion 24 may be disposed in any portion other than the above.

Insulating substrate 21 is equipped with moving arm 25 as a moving member for allowing this insulating substrate 21 to move in the right-left direction in the figure. The moving arm is provided at its terminal end, for example, with a motor, an actuator and the like that are not shown, so that moving arm 25 is freely movable in the right-left direction in FIG. 1 and in the direction perpendicular to the surface of the paper showing the figure (within a region in which insulating substrate 21 faces semiconductor test jig 12). Accordingly, probe substrate 2 including insulating substrate 21 is movable with respect to semiconductor test jig 12 within a region in which this probe substrate 2 faces semiconductor test jig 12.

Specifically, insulating substrate 21 of the present embodiment is sized such that it can face only any one of a plurality of housing portions 17. Insulating substrate 21 can be movable by moving arm 25 with respect to semiconductor test jig 12 within a region in which insulating substrate 21 faces semiconductor test jig 12, from the position at which it faces one housing portion 17 (the first housing portion) of the plurality of housing portions 17 to the position at which it faces the other housing portion 17 (the second housing portion) of the plurality of housing portions 17.

Although FIG. 1 shows a configuration in which insulating substrate 21 is held only by a single moving arm 25, the configuration is not limited thereto, but insulating substrate 21 may be held by a plurality of moving arms 25 (for example, by moving arm 25 attached to each of the right side and the left side of insulating substrate 21 in FIG. 1). Although not shown, moving arm 25 is attached to chuck stage 11 instead of being attached to insulating substrate 21, thereby achieving a configuration in which chuck stage 11 can be movable (while fixing the position of insulating substrate 21). Therefore, moving arm 25 allows probe substrate 2 (insulating substrate 21) to be movable relative to semiconductor test jig 12.

Fluid spraying means 26 is a member installed for supplying a fluid into the space (described later) having semiconductor chip 10 placed therein, during measurement of the electrical characteristics of semiconductor chip 10. In FIG. 1, since probe substrate 2 (shield portion 22) and support substrate 1 (frame portion 13 of semiconductor test jig 12) are not located in proximity to each other and spaced apart from each other, no space is provided therebetween. However, during the actual measurement of the electrical characteristics of semiconductor chip 10, measurement apparatus 100 is in the state where probe substrate 2 (shield portion 22) and support substrate 1 (frame portion 13 of semiconductor test jig 12) are located in proximity to each other. Then, referring to FIG. 3, the states of a P1 portion and a P2 portion in FIG. 1 during the actual measurement of the electrical characteristics of semiconductor chip 10 and the configuration of each member shown in FIG. 1 will be hereinafter described in greater detail.

Figure 3:
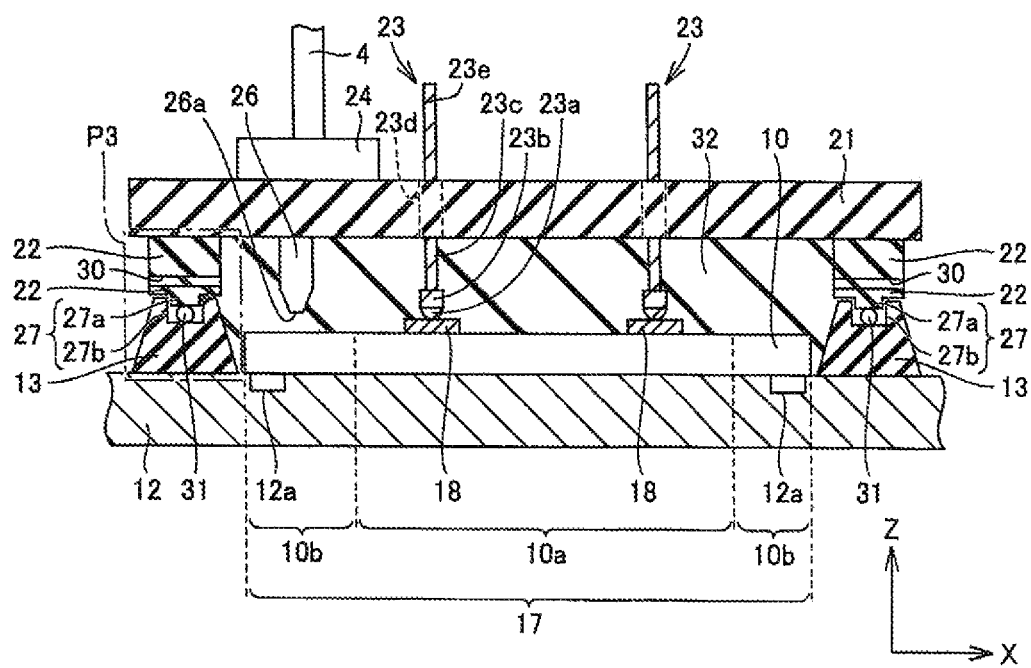
FIG. 3 is a schematic cross-sectional view showing the enlarged first example of the states of a P1 portion and a P2 portion in FIG. 1 in the case where a semiconductor chip is measured using the semiconductor evaluation apparatus in FIG. 1.

FIG. 3 is a schematic cross-sectional view of a portion taken along a line III-III in FIG. 2, that is, a region including one housing portion 17 and one semiconductor chip 10 placed thereon. Referring to FIG. 3, during the actual measurement of the electrical characteristics of semiconductor chip 10, insulating substrate 21 is disposed at the position directly above housing portion 17 on which semiconductor chip 10 to be measure is placed. Then, frame portion 13 surrounding semiconductor chip 10 and shield portion 22 of probe substrate 2 are brought in proximity to each other. The term "in proximity to" used herein more specifically means that frame portion 13 and shield portion 22 are connected to each other, for example, by a seal member 31. This leads to formation of a space 32 between probe substrate 2 and housing portion 17 in which semiconductor chip 10 is housed. Contact probe 23 is provided such that it can be brought into contact with a desired region in semiconductor chip 10 in the state where this space 32 is provided.

Insulating substrate 21 has a shape as a horizontal component extending along the main surface of housing portion 17 (the surface extending in the X direction corresponding to the right-left direction in FIG. 3), and can be disposed so as to face the main surface of semiconductor test jig 12 directly above semiconductor test jig 12 (housing portion 17). Shield portion 22 has a shape as the first vertical component extending in the direction perpendicular to the main surface of housing portion 17 (in the Z direction corresponding to the up-down direction in FIG. 3). This shape is achieved by forming shield portion 22 separately from insulating substrate 21 so as to be connected to one end and the other end in the horizontal direction (in the X direction) in which insulating substrate 21 extends (connected to near the outer periphery of insulating substrate 21 including these ends, as seen in plan view). Furthermore, frame portion 13 has a shape as the second vertical component extending in the direction perpendicular to the main surface of housing portion 17 (in the Z direction corresponding to the up-down direction in FIG. 3).

It is to be noted that the first and second vertical components only have to extend in a direction perpendicular to the horizontal component as seen entirely, and for example, each may be shaped to have a surface inclined (tapered) with respect to the direction perpendicular to the horizontal component.

Accordingly, when shield portion 22 and frame portion 13 are for example brought in closer proximity (for example, connected) to each other by seal member 31, space 32 is provided by the horizontal component included in insulating substrate 21 and the (first and second) vertical components included in shield portion 22 and frame portion 13 so as to surround housing portion 17 on which semiconductor chip 10 is placed.

In addition, a groove portion 12a is formed in a region relatively closer to frame portion 13 so as to surround the outer peripheral portion of an approximately rectangular semiconductor chip 10 as seen in plan view. Groove portion 12a receives foreign substances attached to semiconductor chip 10, for suppressing movement and adhesion of foreign substances to the center portion of housing portion 17.

Then, referring to FIG. 4, a portion at which shield portion 22 and frame portion 13 are connected for providing space 32 will be hereinafter described in detail.

Figure 4:
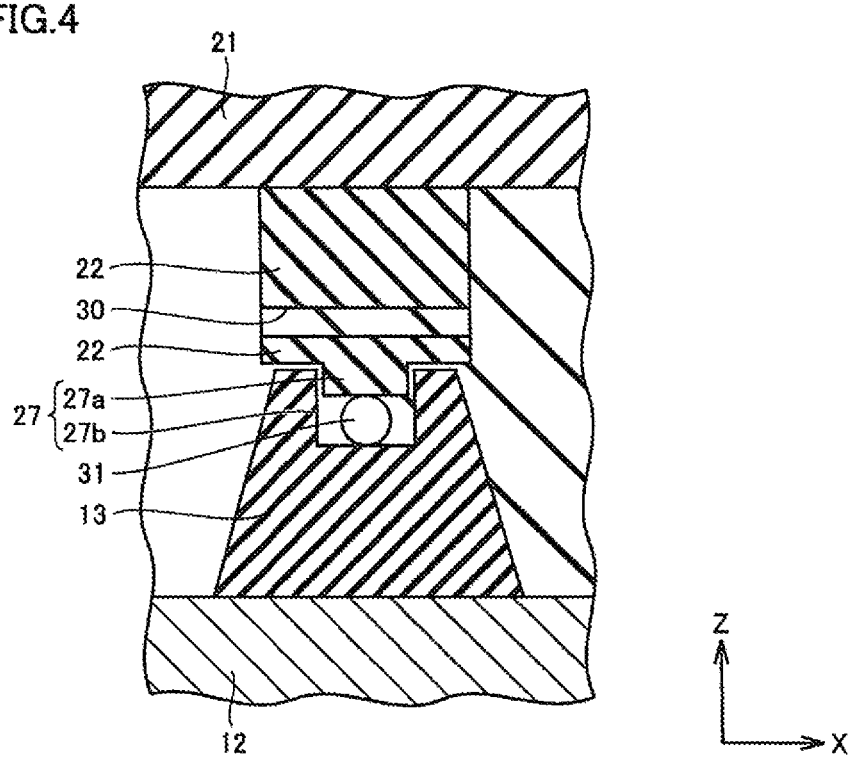
FIG. 4 is a schematic cross-sectional view showing the enlarged first example of the state of a portion at which the first vertical component and the second vertical component are connected, which corresponds to a P3 portion in FIG. 3.
Figure 5:
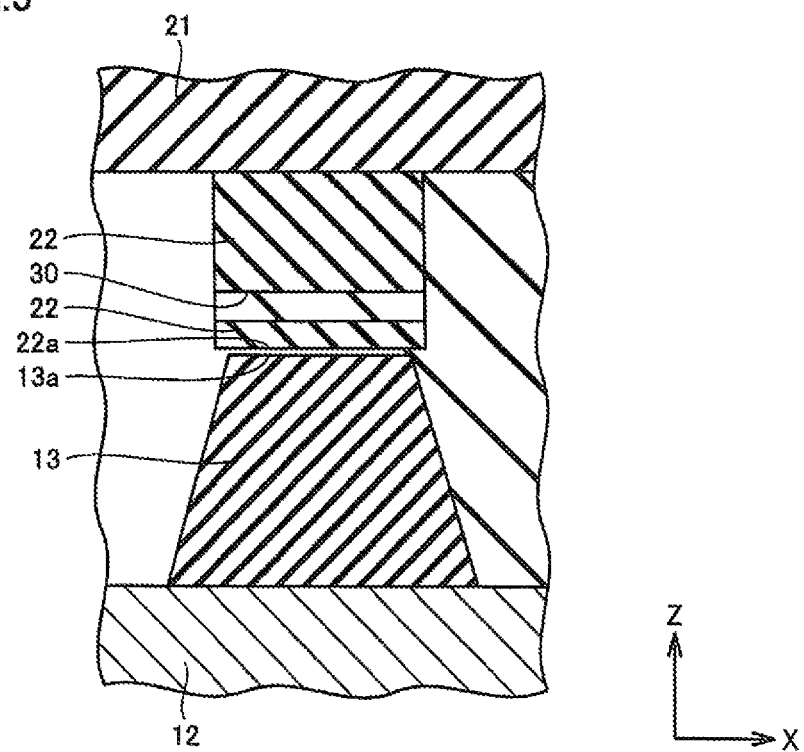
FIG. 5 is a schematic cross-sectional view showing the enlarged second example of the state of a portion at which the first vertical component and the second vertical component are connected, which corresponds to the P3 portion in FIG. 3.
Figure 6:
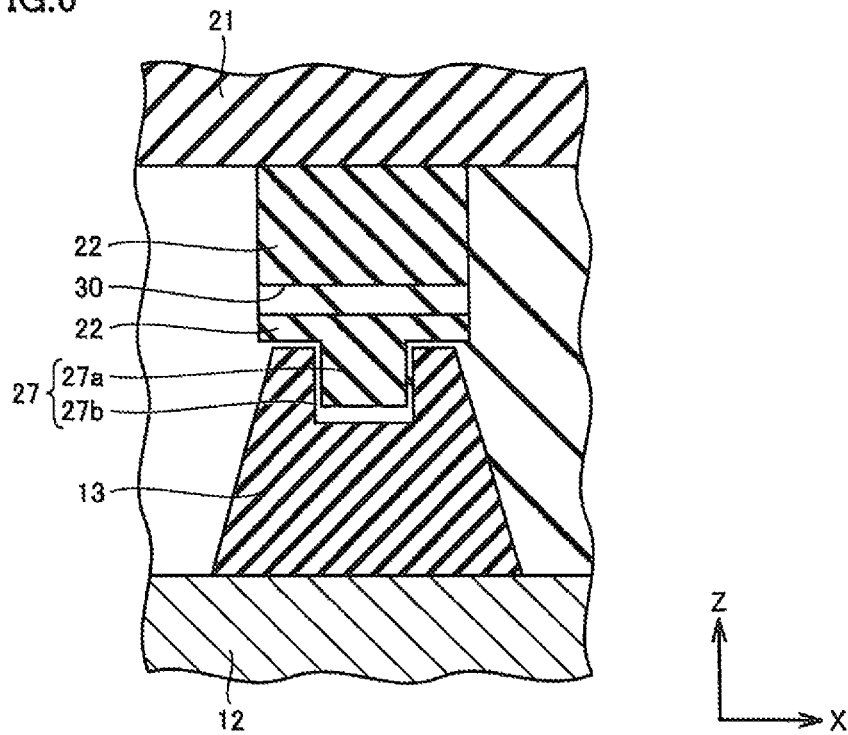
FIG. 6 is a schematic cross-sectional view showing the enlarged third example of the state of a portion at which the first vertical component and the second vertical component are connected, which corresponds to the P3 portion in FIG. 3.

Referring to FIG. 4, the lower surface of shield portion 22 facing frame portion 13 is provided with a convex portion 27a as the first fitting portion while a part of the upper surface of frame portion 13 facing shield portion 22 is provided with a concave portion 27b as the second fitting portion. For example, an annular member like a so-called O ring is disposed as seal member 31 within concave portion 27b. By inserting a part of convex portion 27a into concave portion 27b, convex portion 27a and concave portion 27b hold seal member 31 therebetween so as to come in contact with this seal member 31. In other words, seal member 31 is sandwiched between convex portion 27a and concave portion 27b. This results in a configuration in which shield portion 22 and frame portion 13 are brought into contact with (connected to) each other via seal member 31.

Convex portion 27a is shaped to have a protrusion, for example, of 0.1 mm or more and 20 mm or less in the up-down direction in the figure with respect to the surface on which this convex portion 27 is formed (the surface facing frame portion 13). Similarly, concave portion 27b is shaped to be recessed, for example, by 0.1 mm or more and 20 mm or less in the up-down direction in the figure with respect to the surface on which this concave portion 27b is formed (the surface facing shield portion 22).

When space 32 is provided by seal member 31, semiconductor chip 10 within space 32 can be sealed against the outside. Accordingly, since semiconductor chip 10 disposed within space 32 can be electrically separated from other semiconductor chips 10 on the outside of housing portion 17 having this semiconductor chip 10 placed thereon, it becomes possible to decrease the possibility of undergoing influence of partial discharge caused by other semiconductor chips 10.

Although shield portion 22 and frame portion 13 are connected to each other by seal member 31 in FIGS. 3 and 4, the configuration is not limited thereto. For example, referring to FIG. 5, a lower surface 22a provided in the first vertical component of shield portion 22 and facing frame portion 13 may be brought into contact with an upper surface 13a provided in the second vertical component of frame portion 13 and facing shield portion 22. For example, referring to FIG. 6, convex portion 27a formed on the lower surface provided in the first vertical component of shield portion 22 and facing frame portion 13 and concave portion 27b formed in a part of the upper surface provided in frame portion 13 and facing shield portion 22 are fitted to each other, and thereby connected to each other. Also in the embodiment in FIG. 6, convex portion 27a and concave portion 27b may have a protrusion and a recess, respectively, that are equal in size to those in the embodiment in FIG. 4.

Then, fluid spraying means 26 will be hereinafter described in detail.

Again referring to FIG. 3, fluid spraying means 26 is attached to the horizontal component of insulating substrate 21 of probe substrate 2. In this case, it is preferable that the fluid discharged from fluid spraying means 26 is gas that is specifically thermally and chemically stabilized, excellent in insulation properties and relatively lower in ionization properties. Specifically, it is preferable that the fluid discharged from fluid spraying means 26 is for example carbon dioxide gas or nitrogen gas, but not limited thereto.

When measuring the electrical characteristics of the semiconductor element of semiconductor chip 10, the above-described fluid is supplied from fluid spraying means 26 into space 32 that has been provided. Then, measurement is carried out in the state where the atmosphere concentration of the above-described fluid within space 32 is relatively high, thereby allowing suppression of partial discharge occurring on the surface of semiconductor chip 10 and in proximity thereto. In this case, fluid spraying means 26 is provided in insulating substrate 21 serving as a horizontal component of probe substrate 2, and configured to discharge a fluid toward semiconductor chip 10 located directly below this fluid spraying means 26. Accordingly, the fluid can be evenly supplied over the entire surface of semiconductor chip 10 from directly above semiconductor chip 10, thereby allowing improvement in the effect of suppressing occurrence of partial discharge in the entire semiconductor chip 10.

Furthermore, when gas is used as the above-mentioned fluid, it becomes possible to readily carry out the process of removing the fluid from the surface of semiconductor chip 10 after completion of measurement of semiconductor chip 10, as compared with the case where a liquid is used as the fluid.

In this case, it is preferable that fluid spraying means 26 is provided with a nozzle 26a at its end serving as a fluid discharge port. Fluid spraying means 26 is configured, for example, to have a tapered shape by this nozzle 26a. Due to having nozzle 26a, fluid spraying means 26 can cause the fluid to be discharged at high speed with high efficiency, thereby allowing the fluid to reliably spread to a desired position over the surface of semiconductor chip 10.

Figure 7:
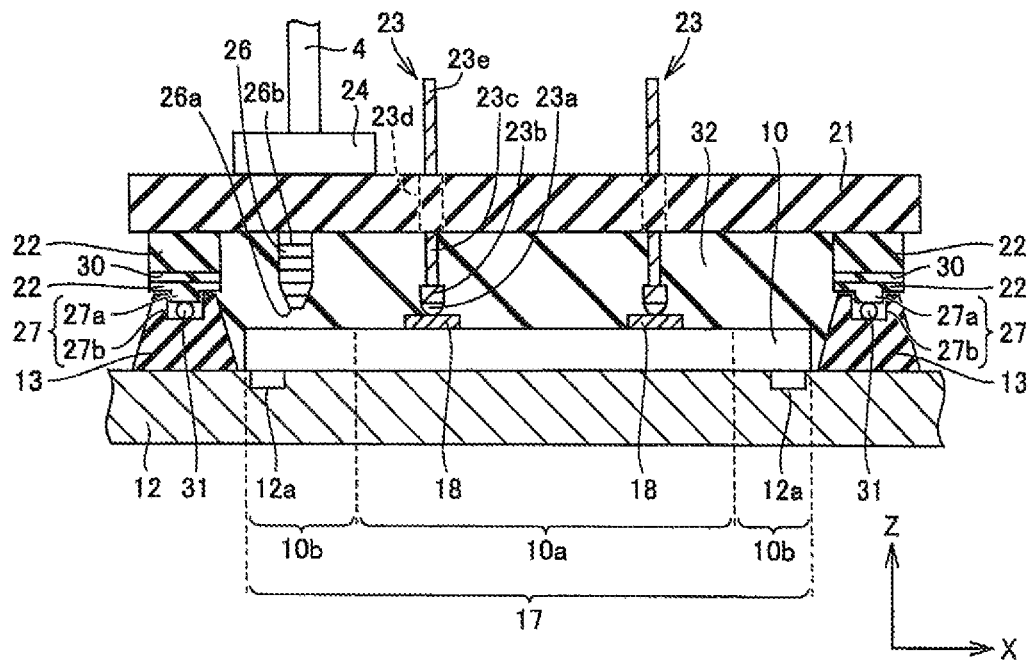
FIG. 7 is a schematic cross-sectional view showing the enlarged second example of the states of the P1 portion and the P2 portion in FIG. 1 in the case where a semiconductor chip is measured using the semiconductor evaluation apparatus in FIG. 1.

Referring to FIG. 7, although the configuration is basically the same as that in FIG. 3, a heater 26b as temperature adjustment means is wound around fluid spraying means 26. For example, an electrically-heated wire is used as heater 26b. This is provided in order to set the temperature of the fluid discharged from fluid spraying means 26 at a relatively higher temperature that is equal to the temperature of semiconductor chip 10 at which the fluid is supplied. Specifically, it is preferable that heater 26b has a configuration capable of adjusting the temperature of the fluid discharged from fluid spraying means 26, for example, such that the difference between the temperature of the fluid discharged from fluid spraying means 26 and the temperature of semiconductor chip 10 is equal to or lower than 3 degrees.

In evaluation of the electrical characteristics of, for example, the vertical semiconductor element formed in semiconductor chip 10, there may be a case where the temperature characteristics are also evaluated. Accordingly, the temperature range may extend from a lower temperature to a higher temperature (specifically, from about 40 degrees below zero to about 200 degrees below zero, for example). Consequently, when the difference between the temperature of the fluid supplied during evaluation and the temperature of semiconductor chip 10 is relatively large, the temperature of semiconductor chip 10 becomes unstable due to the influence caused by spraying the fluid. Thus, reliable evaluation results of the temperature characteristics may not be obtained.

Accordingly, heater 26b is additionally provided in fluid spraying means 26 as shown in FIG. 7 to cause a current to flow through heater 26b, thereby allowing the temperature of the supplied fluid to be controlled at a desired temperature. Although heater 26b is presented as temperature adjustment means, the temperature adjustment means is not limited thereto. For example, a fluid may be heated by means of near-infrared radiation, or may be heated using a so-called Peltier element.

Figure 8:
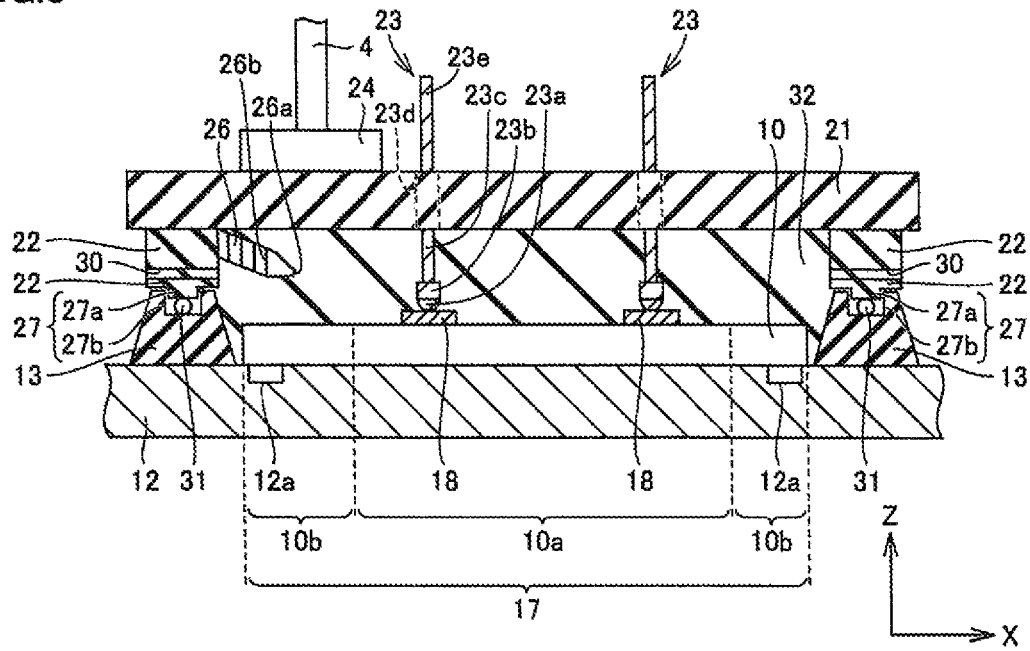
FIG. 8 is a schematic cross-sectional view showing the enlarged third example of the states of the P1 portion and the P2 portion in FIG. 1 in the case where a semiconductor chip is measured using the semiconductor evaluation apparatus in FIG. 1.

Referring to FIG. 8, although the configuration is basically the same as that in FIG. 3, fluid spraying means 26 is attached to shield portion 22 serving as the above-described first vertical component of probe substrate 2. Fluid spraying means 26 is attached so as to extend in the oblique direction with respect to both of the right-left direction and the up-down direction in FIG. 8, for discharging the fluid in this oblique direction. Accordingly, the fluid is mainly supplied to an outer peripheral portion 10b of semiconductor chip 10.

Partial discharge occurs not only in an element portion 10a corresponding to an active region, but also frequently in outer peripheral portion 10b therearound. Accordingly, the configuration in which fluid spraying means 26 is attached to the first vertical component as shown in FIG. 8 provides practical benefits in the case where a fluid needs to be intensively supplied particularly to outer peripheral portion 10b.

Figure 9:
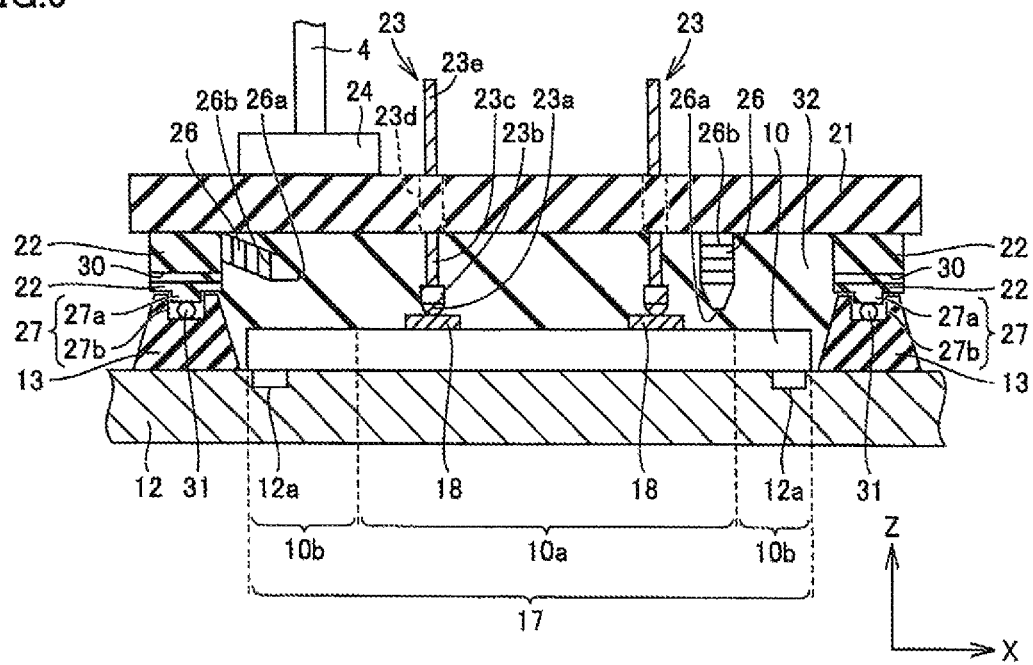
FIG. 9 is a schematic cross-sectional view showing the enlarged fourth example of the states of the P1 portion and the P2 portion in FIG. 1 in the case where a semiconductor chip is measured using the semiconductor evaluation apparatus in FIG. 1.

Referring to FIG. 9, fluid spraying means 26 may be attached at each of the position shown in FIG. 7 and the position shown in FIG. 8. In this way, the fluid can be supplied from above semiconductor chip 10 onto the entire surface of semiconductor chip 10, and further can be intensively supplied also to outer peripheral portion 10b of semiconductor chip 10. Therefore, occurrence of partial discharge can be suppressed much more reliably.

Then, since the pressure in space 32 is raised by discharging the fluid described above, at least one vent 30 is provided in shield portion 22, for example, in FIGS. 3 to 9, for the purpose of suppressing an excessive pressure rise within space 32. Vent 30 extends from within shield portion 22, that is, from within space 32 provided during measurement of semiconductor chip 10 through shield portion 22 to the outside of shield portion 22, that is, to the outside of space 32 provided during measurement of semiconductor chip 10.

Figure 10:
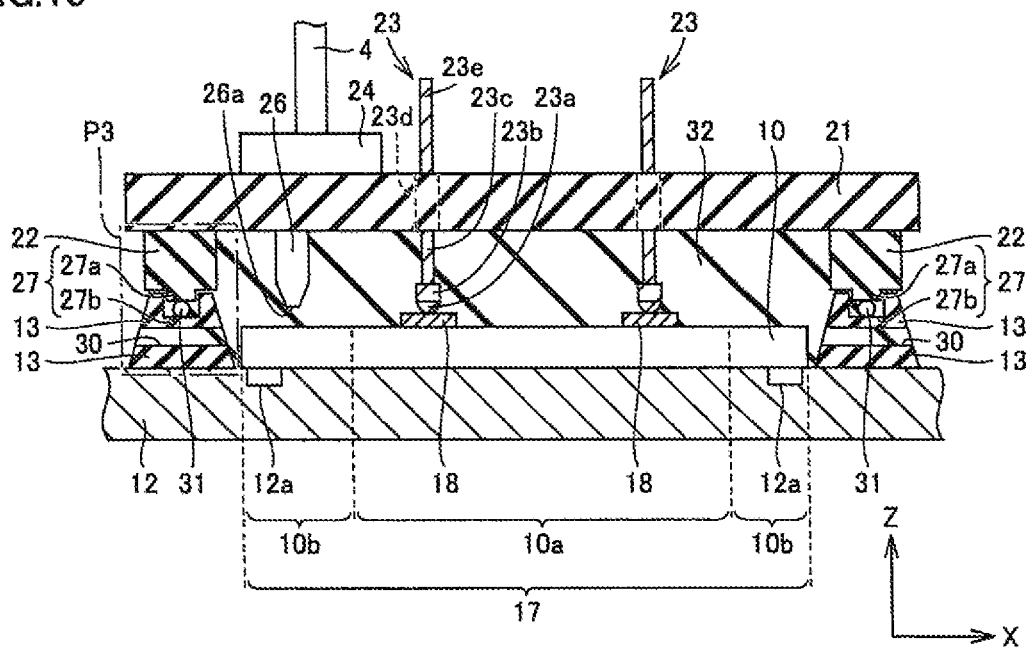
FIG. 10 is a schematic cross-sectional view showing the enlarged fifth example of the states of the P1 portion and the P2 portion in FIG. 1 in the case where a semiconductor chip is measured using the semiconductor evaluation apparatus in FIG. 1.

Referring to FIG. 10, at least one vent 30 may be formed in frame portion 13 in place of shield portion 22. Also in this case, vent 30 extends from within frame portion 13, that is, from within space 32 provided during measurement of semiconductor chip 10, through frame portion 13 to the outside of frame portion 13, that is, to the outside of space 32 provided during measurement of semiconductor chip 10, as in the case where vent 30 is provided in shield portion 22. Although not shown, vent 30 may be provided in insulating substrate 21, for example.

Figure 11:
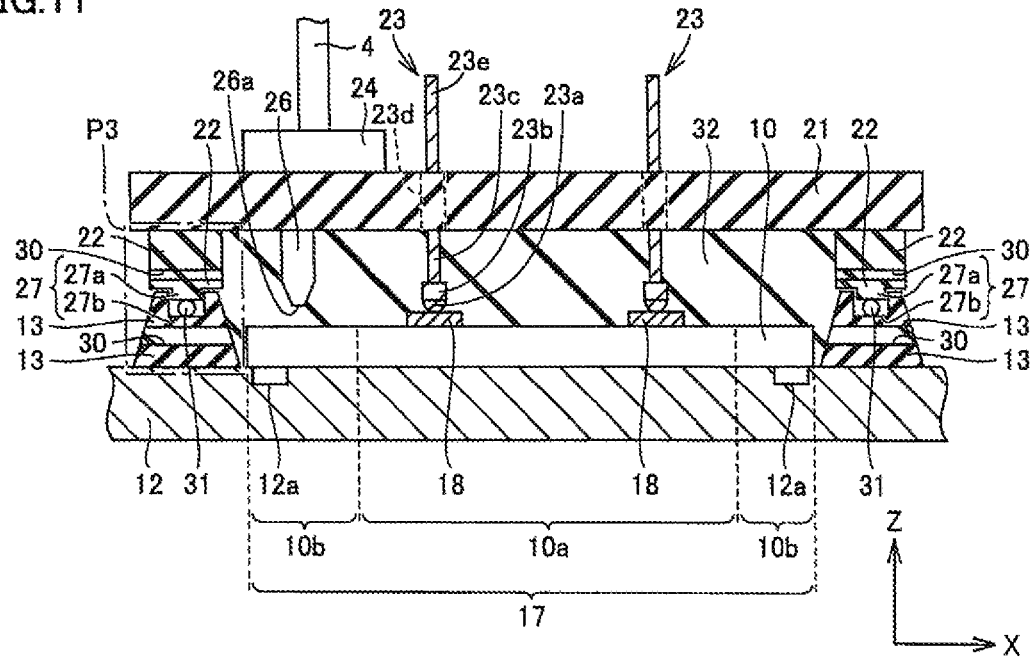
FIG. 11 is a schematic cross-sectional view showing the enlarged sixth example of the states of the P1 portion and the P2 portion in FIG. 1 in the case where a semiconductor chip is measured using the semiconductor evaluation apparatus in FIG. 1.

Referring to FIG. 11, vent 30 may be provided in both of shield portion 22 and frame portion 13. This allows further improvement in the effect of suppressing excessive pressurization within space 32.

Then, a modification of probe substrate 2 will be described with reference to FIGS. 12 and 13.

Figure 12:
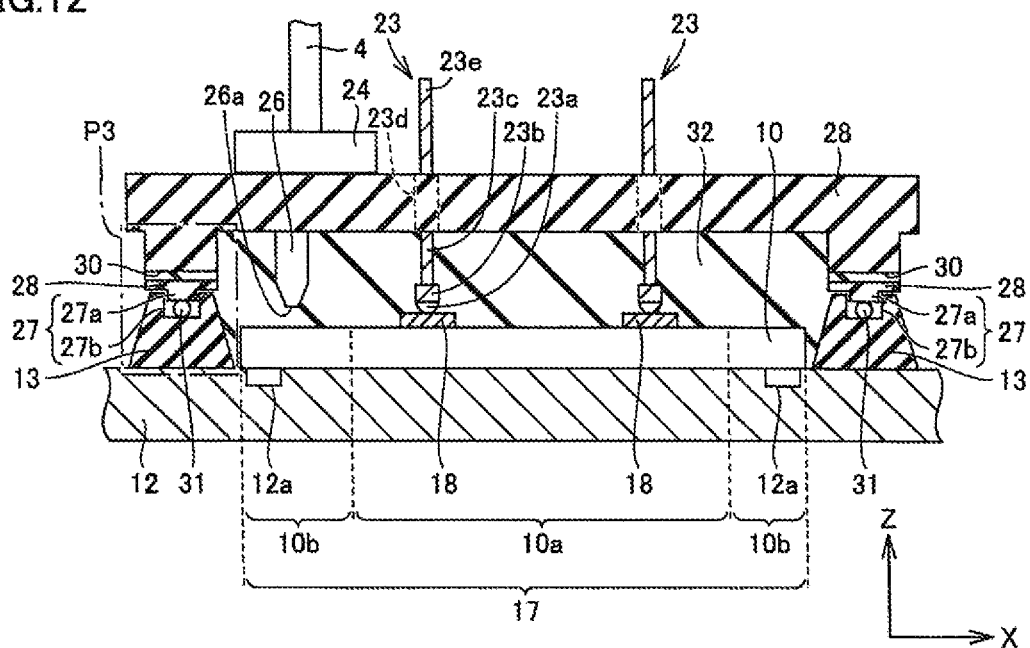
FIG. 12 is a schematic cross-sectional view showing the enlarged seventh example of the states of the P1 portion and the P2 portion in FIG. 1 in the case where a semiconductor chip is measured using the semiconductor evaluation apparatus in FIG. 1.
Figure 13:
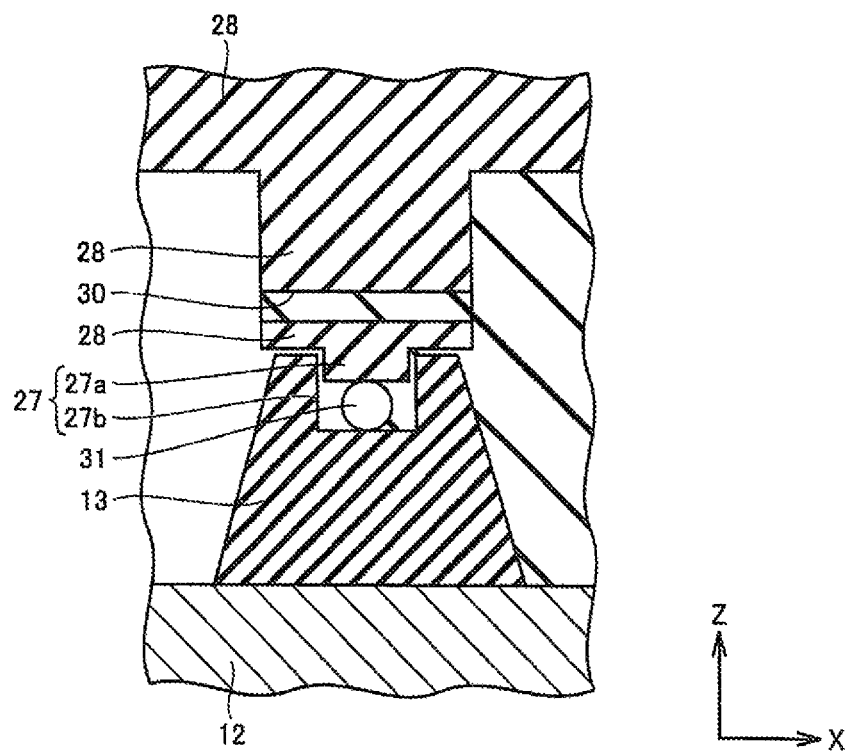
FIG. 13 is a schematic cross-sectional view showing an enlarged view of a portion at which the first vertical component and the second vertical component are connected, which corresponds to a P3 portion in FIG. 12.

Referring to FIGS. 12 and 13, these configurations are basically the same as those in FIGS. 3 and 4, respectively. However, FIG. 12 is different in configuration of probe substrate 2 from FIG. 3. Specifically, probe substrate 2 in FIG. 12 does not have a configuration in which insulating substrate 21 and shield portion 22 separately provided are connected to each other, but is configured as an integrated insulating shield portion 28 having these insulating substrate 21 and shield portion 22 provided as an integral component. Integrated insulating shield portion 28 is made of an insulating material similarly to insulating substrate 21, and functions as a shield against electrolysis similarly to shield portion 22.

FIG. 12 is identical in configuration to FIG. 3 other than those described above, and integrated insulating shield portion 28 is identical in shape and size to the member to which insulating substrate 21 and shield portion 22 are connected. Therefore, as with probe substrate 2 in FIG. 3, integrated insulating shield portion 28 has a horizontal component extending in the right-left direction in the figure along the main surface of housing portion 17 facing this integrated insulating shield portion 28, and the first vertical component extending in the up-down direction in the figure perpendicular to the main surface of housing portion 17. The horizontal component can be disposed so as to face the main surface of semiconductor test jig 12 directly above semiconductor test jig 12 (housing portion 17). The first vertical component is formed so as to extend from each of one end and the other end of insulating substrate 21 in the horizontal direction in which insulating substrate 21 extends (from near the outer periphery of insulating substrate 21 including these ends as seen in plan view) toward the direction perpendicular to (crossing) the main surface of semiconductor test jig 12. Furthermore, contact probe 23 is disposed to extend in the up-down direction in the figure so as to extend through a hole portion (not shown) provided in the horizontal component from one main surface of the horizontal component to the other main surface thereof. Then, this contact probe 23 is held by this horizontal component.

Insulating substrate 21 and shield portion 22 forming probe substrate 2 may have any configuration as long as these insulating substrate 21 and shield portion 22 have insulating properties and shielding properties as described above to achieve functions and effects that can suppress partial discharge within space 32 during measurement of semiconductor chip 10.

Then, the configuration of contact probe 23 will be hereinafter described in detail again with reference to FIG. 3.

For example, in its center portion as seen in plan view, semiconductor chip 10 has element portion 10a serving as an active region and provided for example with a vertical semiconductor element (not shown). Semiconductor chip 10 also has outer peripheral portion 10b formed around this element portion. In element portion 10a, a vertical semiconductor element and an electrode pad 18 for extracting an electrical signal of this vertical semiconductor element are formed. Frame portion 13 and shield portion 22 are brought in proximity to each other and fitted to each other to provide space 32, thereby bringing contact probe 23 into contact with electrode pad 18. Accordingly, contact probe 23 can transmit an electrical signal between electrode pad 18 and signal line 4.

Contact probe 23 has a contact portion 23a, an end portion 23b, a push-in portion 23c, a substrate installation portion 23d, and an electrical connection portion 23e in this order from the bottom in FIG. 3. Contact portion 23a is a portion that can be mechanically and electrically brought into contact with electrode pad 18. End portion 23b is a portion provided at the end of the entire contact probe 23 including contact portion 23a (in the lower portion in the figure). Push-in portion 23c is a region that can slide through a spring member incorporated within substrate installation portion 23d when contact portion 23a is brought into contact with electrode pad 18. This push-in portion 23c extends in the up-down direction in the figure. Substrate installation portion 23d is a region placed as a base for the entire contact probe 23 and fixed to insulating substrate 21 so as to extend through insulating substrate 21. Electrical connection portion 23e is a portion electrically in communication with end portion 23b, thereby serving to input and output an electrical signal to and from the outside.

Contact probe 23 is made of a metal material having conductivity such as copper, tungsten and rhenium tungsten, but not limited thereto. Particularly, contact portion 23a may be covered with another material such as gold, palladium, tantalum, platinum for the purpose of improving conductivity and durability.

Then, the operation of contact probe 23 will be hereinafter described with reference to FIGS. 14(A) to 14(C).

Figures 14A, 14B, 14C:
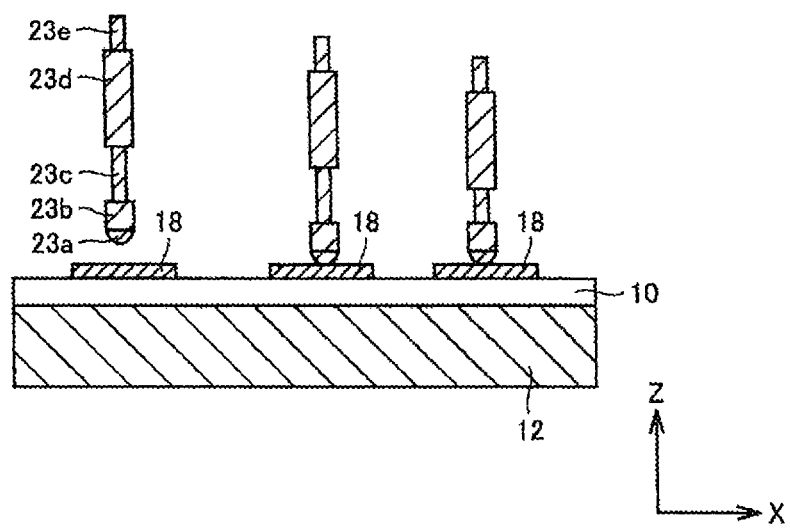
FIG. 14(A) is a schematic cross-sectional view showing the first step of a method of bringing a contact probe into contact with an electrode pad.
FIG. 14(B) is a schematic cross-sectional view showing the second step of the method of bringing the contact probe into contact with the electrode pad.
FIG. 14(C) is a schematic cross-sectional view showing the third step of the method of bringing the contact probe into contact with the electrode pad.

Referring to FIG. 14(A), in the initial state before measurement of semiconductor chip 10, for example, where shield portion 22 and frame portion 13 are not in proximity to each other, contact portion 23a of contact probe 23 is not in contact with electrode pad 18, but contact probe 23 floats above electrode pad 18. Referring to FIG. 14(B), when probe substrate 2 is lowered in the downward direction along the Z-axis, and shield portion 22 and frame portion 13 are brought in proximity to each other, contact probe 23 fixed to insulating substrate 21 is also lowered. Contact portion 23a and electrode pad 18 are brought in proximity to each other, and then, brought into contact with each other. Referring to FIG. 14(C), when probe substrate 2 is further lowered (shield portion 22 and frame portion 13 are brought into contact with each other), push-in portion 23c is pushed in so as to be housed within the spring member disposed within substrate installation portion 23d by the function of this spring member. This ensures electrical connection between electrode pad 18 and contact probe 23.

Although contact probe 23 is configured to be slidable in the up-down direction using a spring having slidability in the up-down direction in FIGS. 14(A) to 14(C) in this case, the configuration is not limited thereto, but so-called stacked probes or a wire probe may be used. Furthermore, a so-called cantilever-type contact probe 23 may be used.

Furthermore, electrical connection portion 23e mentioned above is electrically connected to connection portion 24 by a wiring line (not shown) or the like.

Then, a measuring method employing measurement apparatus 100 will be hereinafter described as a semiconductor evaluation method of the present embodiment with reference to FIGS. 15(A) to 15(D) as appropriate.

Referring to FIG. 15(A) and FIGS. 1 to 3, semiconductor test jig 12 is first prepared on which a plurality of semiconductor chips 10 can be placed. The plurality of semiconductor chips 10 are separately placed in a plurality of housing portions 17, respectively, that are divided by frame portion 13 on the surface of semiconductor test jig 12. One semiconductor chip 10 is placed on one housing portion 17 in this case. This semiconductor test jig 12 is fixed to a desired portion on the upper surface of chuck stage 11.

On the other hand, the degree of parallelization for contact portions 23a of a plurality of contact probes 23 fixed to probe substrate 2 is adjusted. Specifically, the heights of the plurality of contact probes 23 in the up-down direction shown in FIGS. 14(A) to 14(C) are adjusted such that contact portions 23a of contact probes 23 become identical in height when contact probes 23 are lowered to a certain level, for example.

Figure 15A:
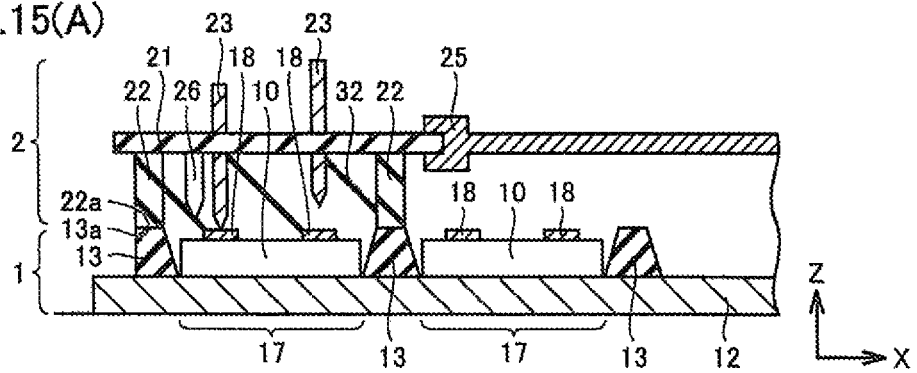
FIG. 15(A) is a schematic cross-sectional view showing the first step of a semiconductor evaluation method in the first embodiment of the present invention.

For example as shown in FIG. 15(A), two adjacent housing portions 17 divided by frame portion 13 will be described. Probe substrate 2 is moved by moving arm 25 such that probe substrate 2 is located to face left-side housing portion 17 (the first housing portion) that is one of two housing portions 17. Then, probe substrate 2 (shield portion 22 in this case) and frame portion 13 are brought in proximity (for example, connected) to each other, thereby providing space 32 between first housing portion 17 and probe substrate 2 facing thereto. In this state, the element of semiconductor chip 10 can be measured. In this case, it is preferable that probe substrate 2 (shield portion 22) and frame portion 13 are brought in proximity to each other in such a manner that probe substrate 2 (shield portion 22) and frame portion 13 come in contact with each other as shown in any one of FIGS. 4 to 6.

In this state, contact probe 23 directly above desired electrode pad 18 is lowered such that electrode pad 18 connected to the element to be measured and contact probe 23 are brought into contact with each other. In FIG. 15(A), left-side contact probe 23 of a pair of right and left contact probes 23 is lowered and brought into contact with electrode pad 18. The electrical characteristics of the measurable element are measured by this electrode pad 18 in this state.

It is to be noted that a fluid is sprayed onto the surface of semiconductor chip 10 from fluid spraying means 26 during the above-described measurement. It is preferable to maintain the state, at least during evaluation, where the atmosphere concentration of the fluid is relatively high near the surface of semiconductor chip 10, and to complete supply of the fluid at least at the end of evaluation. Furthermore, during this measurement, semiconductor chip 10 to be measured is electrically separated from the outside of space 32 by frame portion 13, shield portion 22, insulating substrate 21 and the fluid, thereby improving the effect of suppressing partial discharge.

Figure 15B:
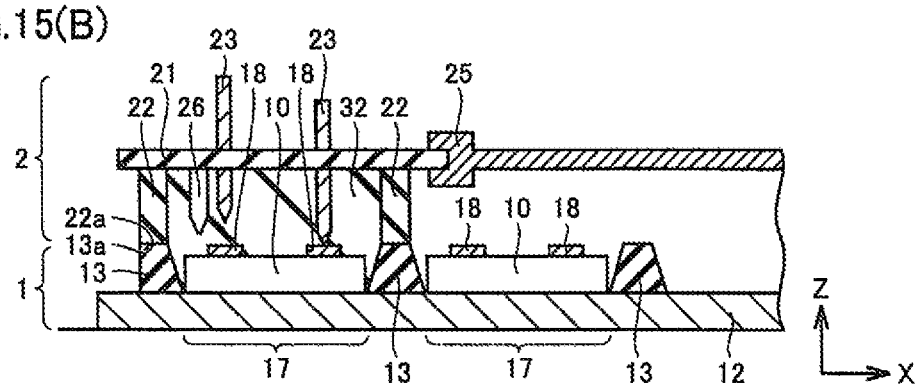
FIG. 15(B) is a schematic cross-sectional view showing the second step of the semiconductor evaluation method in the first embodiment of the present invention.

Referring to FIG. 15(B), left-side contact probe 23 of a pair of right and left contact probes 23 in FIG. 15(B) is then raised while right-side contact probe 23 is instead brought into contact with electrode pad 18 located directly therebelow. The electrical characteristics of the measurable element are measured by this electrode pad 18 in this state.

Figure 15C:
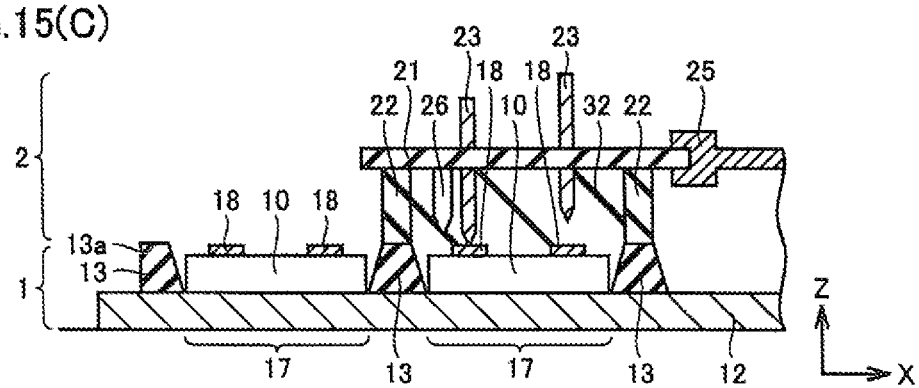
FIG. 15(C) is a schematic cross-sectional view showing the third step of the semiconductor evaluation method in the first embodiment of the present invention.

Referring to FIG. 15(C), when measurement of semiconductor chip 10 in first housing portion 17 ends, supply of the fluid from fluid spraying means 26 is stopped. Then, by moving arm 25, probe substrate 2 is moved from the position where it faces first housing portion 17 to the position where it faces right-side housing portion 17 (the second housing portion) different from first housing portion 17. Then, as in FIG. 15(A), probe substrate 2 (shield portion 22 in this case) and frame portion 13 are brought in proximity to each other, thereby providing space 32 between second housing portion 17 and probe substrate 2 facing thereto.

In this state, for example, left-side contact probe 23 of a pair of right and left contact probes 23 is lowered and brought into contact with electrode pad 18 as in FIG. 15(A), so that the electrical characteristics of the measurable element are measured by electrode pad 18.

Figure 15D:
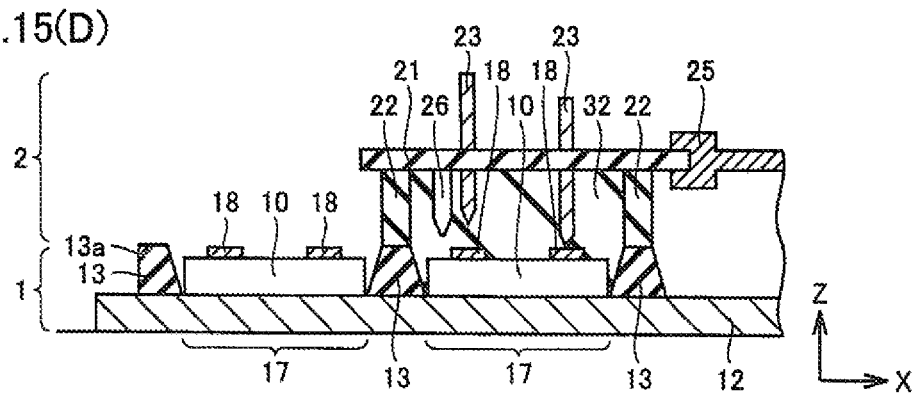
FIG. 15(D) is a schematic cross-sectional view showing the fourth step of the semiconductor evaluation method in the first embodiment of the present invention.

Referring to FIG. 15(D), right-side contact probe 23 is then brought into contact with electrode pad 18 as in FIG. 15(B), thereby measuring the electrical characteristics of the measurable element.

The operations similar to those in FIGS. 15(A) to 15(D) described above are hereafter repeated, thereby measuring the electrical characteristics of the semiconductor elements formed in all of semiconductor chips 10 placed on semiconductor test jig 12.

When it is desired to carry out measurement using particularly a large current, both of left-side and right-side contact probes 23 may be brought into contact with electrode pad 18, for example, in the step in FIG. 15(A), to simultaneously measure the (plurality of) elements connected to these electrode pads 18. This allows further improvement in the efficiency of measurement and also allows measurement using a still larger current.

Then, the functions and effects of the present embodiment described above will be hereinafter explained.

In the present embodiment, the electrical characteristics are measured in the state where a plurality of semiconductor chips 10 are placed so as to be electrically divided from each other by frame portion 13 and in the state where a (for example, sealed) space 32 is provided between each of these divided semiconductor chips 10 and probe substrate 2. Accordingly, a plurality of semiconductor chips 10 can be collectively placed on semiconductor test jig 12 to control the position (to which contact probe 23 is to be moved). Therefore, the efficiency of the operation of measuring each semiconductor chip 10 can be improved.

Furthermore, insulating substrate 21 and shield portion 22 forming probe substrate 2 functions as a shield against an electric field, and semiconductor chip 10 is placed within space 32 provided such that this semiconductor chip 10 is surrounded by surrounding members during measurement of this semiconductor chip 10 and a fluid is supplied to this space 32, with the result that semiconductor chip 10 can be precisely measured without undergoing any influence of atmospheric air and the like on the outside of space 32. Accordingly, occurrence of partial discharge during measurement of semiconductor chip 10 can be reliably suppressed.

Furthermore, in the present embodiment, probe substrate 2 can be moved sequentially to semiconductor chips 10 placed on the plurality of housing portions 17, respectively, for measuring each semiconductor chip 10. Accordingly, a plurality of semiconductor chips 10 can be measured by a single set of measuring operations. Also in this point, the efficiency of the operation of measuring each semiconductor chip 10 can be improved.

Second Embodiment

Figure 16:
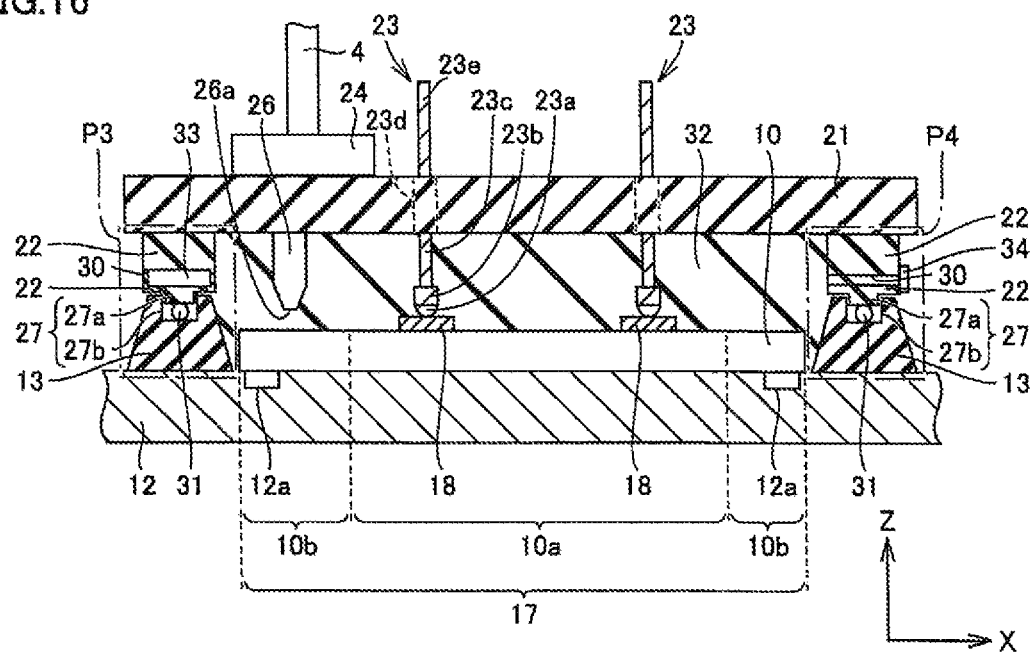
FIG. 16 is a schematic cross-sectional view showing an enlarged view of the P1 portion and the P2 portion in FIG. 1 in the case where a semiconductor chip is measured using a semiconductor evaluation apparatus in the second embodiment of the present invention.
Figure 17:
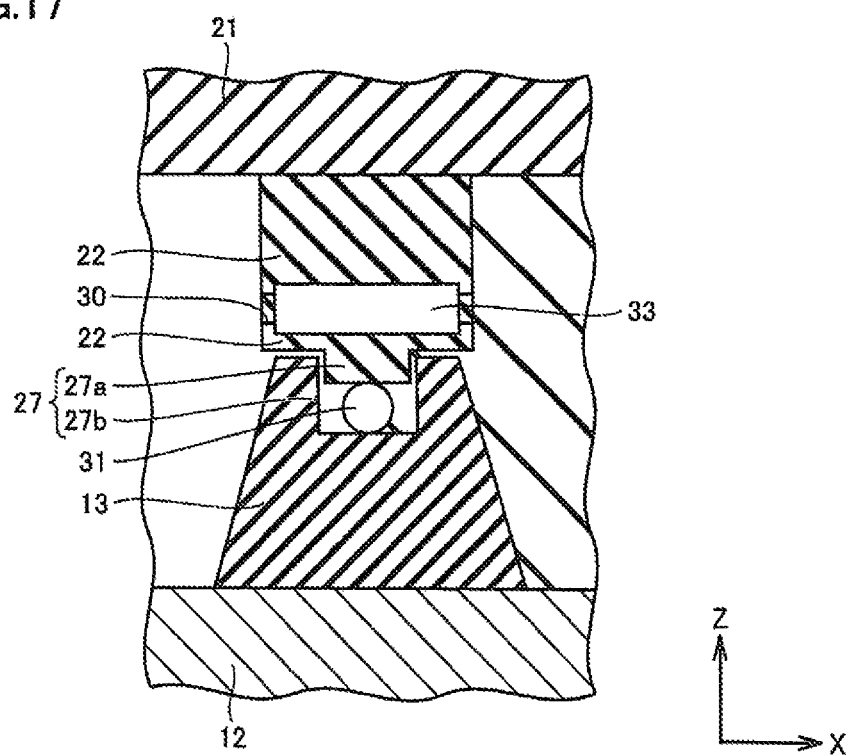
FIG. 17 is a schematic cross-sectional view showing an enlarged view of a portion at which the first vertical component and the second vertical component are connected, which corresponds to a P3 portion in FIG. 16.
Figure 18:
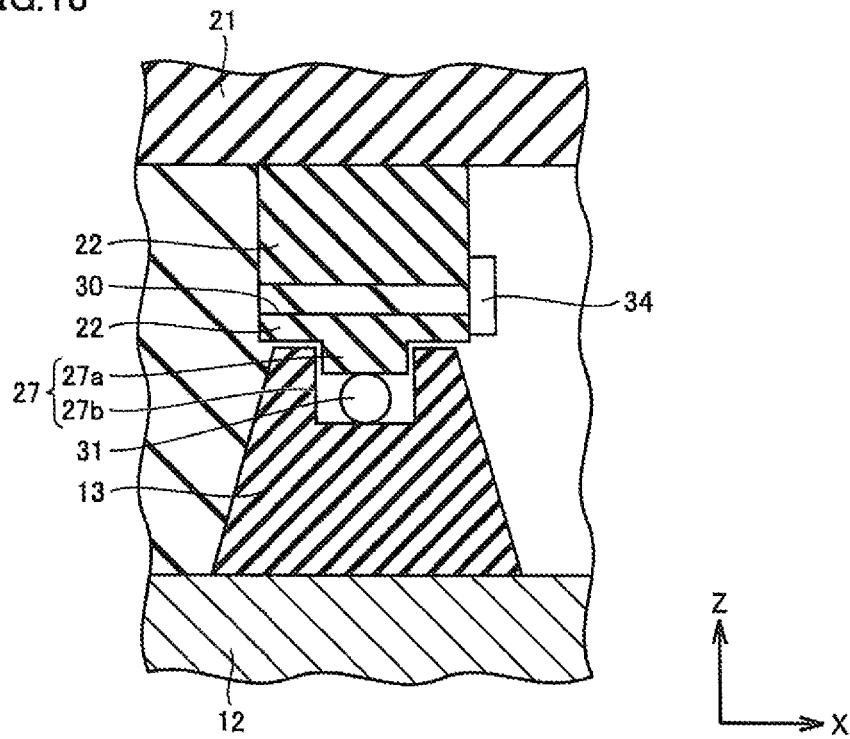
FIG. 18 is a schematic cross-sectional view showing an enlarged view of a portion at which the first vertical component and the second vertical component are connected, which corresponds to a P4 portion in FIG. 16.

Referring to FIGS. 16 to 18, the present embodiment is also basically identical in configuration to FIGS. 3 and 4 in the first embodiment, for example. However, the present embodiment is different from the first embodiment in that vent 30 is provided with a constant-pressure valve 33 and opening and closing means 34. Constant-pressure valve 33 used herein is a member functioning to arbitrarily adjust the opening degree of the valve in order to maintain space 32 at a constant pressure, and may be a solenoid valve such as a pilot valve, for example. Opening and closing means 34 is a member such as a valve opened and closed for discharging a fluid within space 32 to the outside, and may be an electrical or mechanical shutter, or a bimetallic element, for example.

Although constant-pressure valve 33 and opening and closing means 34 are shown in different external appearances in this case so as to be distinguishable at a glance, the external appearances are not limited thereto, but constant-pressure valve 33 and opening and closing means 34 each can be formed in any external appearance that can achieve a desired function. For example, constant-pressure valve 33 may be similar in external appearance to opening and closing means 34.

In addition, since the configuration of the present embodiment other than those described above is almost the same as the configuration of the first embodiment, the same components are designated by the same reference characters, and description thereof will not be repeated.

Then, the functions and effects of the present embodiment will be described.

In the present embodiment, when a fluid is started to be supplied into space 32 during measurement, opening and closing means 34 can be opened to discharge the fluid within space 32 to the outside. Furthermore, after a lapse of a desired time period since the fluid is started to be supplied into space 32, opening and closing means 34 is closed to stop discharge of the fluid through vent 30, thereby pressurizing space 32, and adjusting constant-pressure valve 33 to a desired opening degree, so that the pressure within space 32 can be maintained constant. Consequently, the electrical characteristics of semiconductor chip 10 can be measured in the state where the pressure within space 32 is stabilized.

Since the threshold voltage produced by partial discharge can be kept constant by maintaining the pressure within space 32 at a desired value, that is, by the so-called Paschen's law, occurrence of partial discharge can be suppressed much more reliably as compared with the first embodiment.

Third Embodiment

Figure 19:
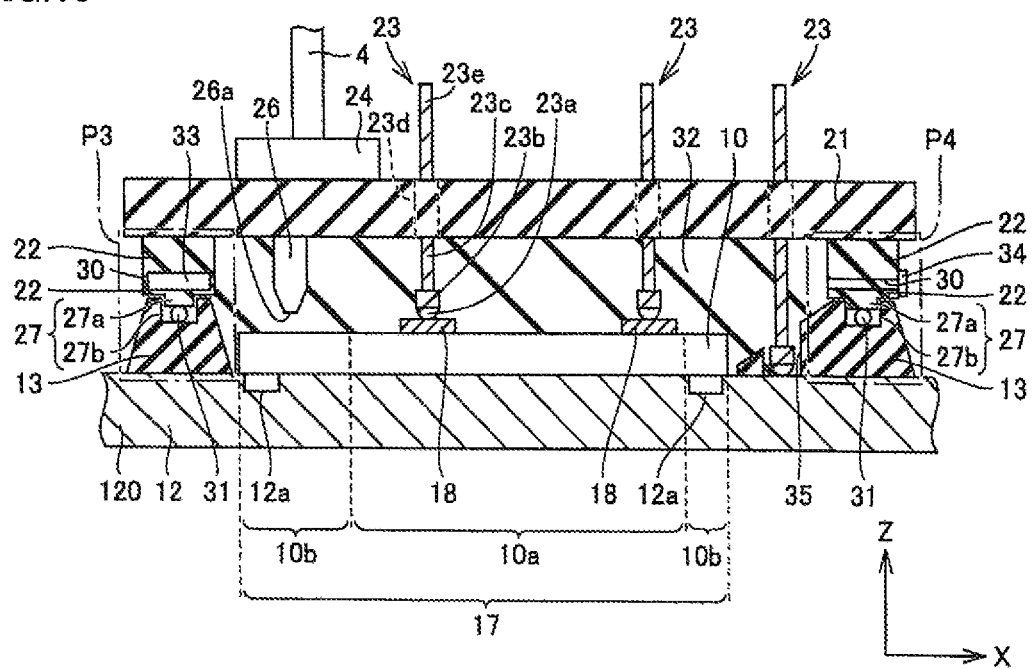
FIG. 19 is a schematic cross-sectional view showing an enlarged view of the P1 portion and the P2 portion in FIG. 1 in the case where a semiconductor chip is measured using a semiconductor evaluation apparatus in the third embodiment of the present invention.

Referring to FIG. 19, the present embodiment is also basically identical in configuration, for example, to FIG. 16 in the second embodiment. However, an opening 35 is provided in a part of frame portion 13 in this case, and a backside electrode of semiconductor chip 10 having a vertical semiconductor element formed therein is removed by contact probe 23 from the upper side (the surface side) of semiconductor chip 10 through opening 35. In this point, FIG. 19 is different from each of other examples described above in which a backside electrode of semiconductor chip 10 is removed from chuck stage 11.

In FIG. 19, the inside inclined plane of right-side frame portion 13 in the figure is inclined at an angle with respect to the right-left direction in the figure that is smaller than the angles of other inclined planes. Opening 35 is provided so as to extend from this inside inclined plane through frame portion 13 in the up-down direction in the figure to pedestal 120 of semiconductor test jig 12. Then, contact probe 23 extending through this opening 35 acts to remove the backside electrode of the semiconductor element in semiconductor chip 10 out to the upper side of semiconductor chip 10 through a wiring line (not shown).

Since the configuration of the present embodiment other than those described above is almost the same as the configuration of the first embodiment, the same components are designated by the same reference characters, and description thereof will not be repeated.

For example, in each of the above-described examples, the backside electrode of semiconductor chip 10 is removed from chuck stage 11 for suppressing occurrence of partial discharge. In FIG. 19, however, since occurrence of partial discharge is reliably suppressed by providing all of insulating substrate 21, shield portion 22, fluid spraying means 26, and constant-pressure valve 33 shown in the second embodiment, removal of the backside electrode can be done from the surface side. When removal of all electrodes including the backside electrode are done from the surface side, the wiring lines leading to corresponding electrodes can be set to have the same length while an inductance and a resistance can be set constant, so that more reliable measurement can be carried out.

In the present embodiment, for example, frame portion 13 and shield portion 22 may be made of a conductive material as long as the effect of suppressing partial discharge is relatively high.

Fourth Embodiment

First, the configuration of the measurement apparatus will be described as the configuration of a semiconductor evaluation apparatus of the present embodiment with reference to FIG. 20.

Figure 20:
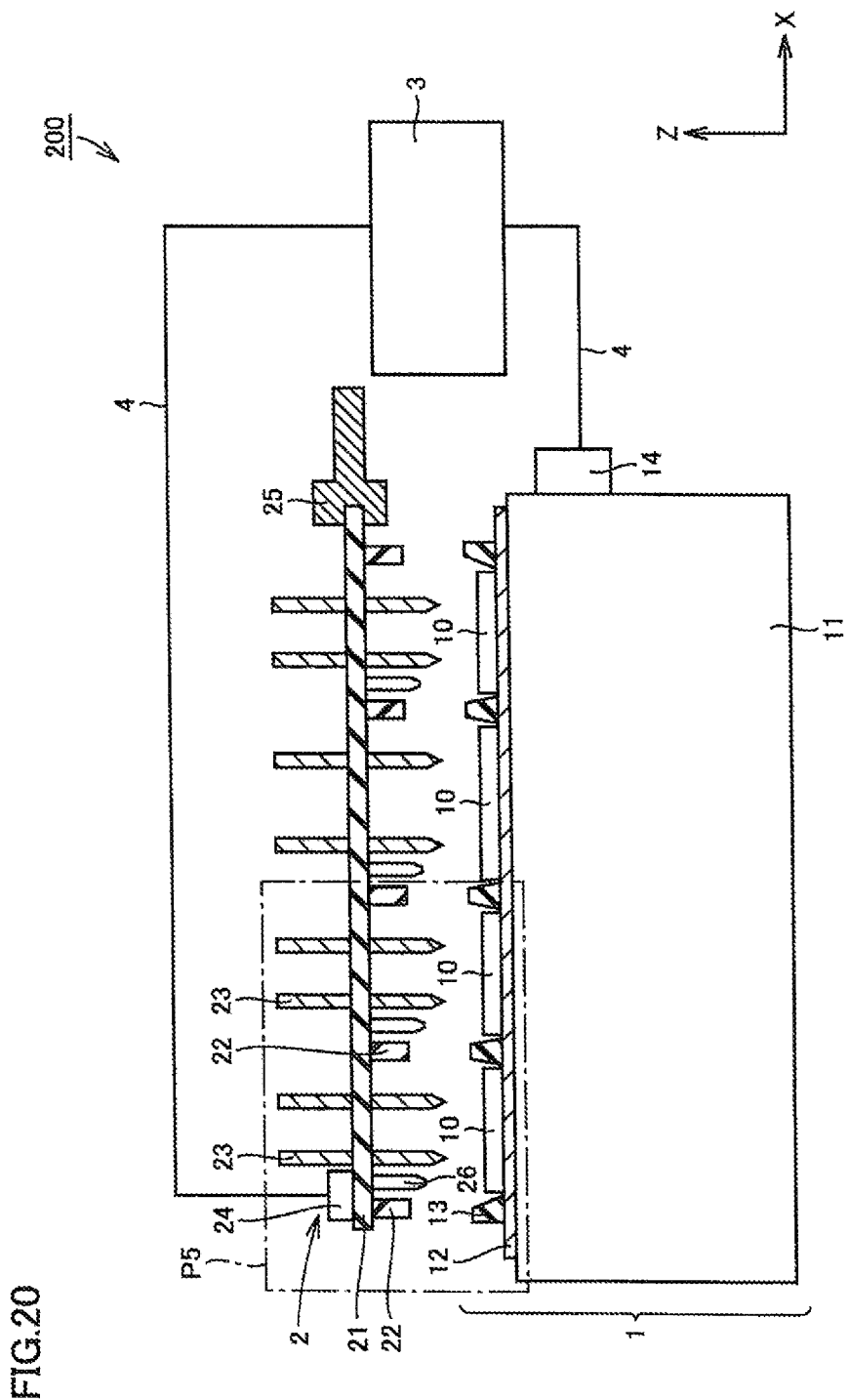
FIG. 20 is a schematic cross-sectional view of a semiconductor evaluation apparatus in the fourth embodiment of the present invention.

Referring to FIG. 20, measurement apparatus 200 of the present embodiment is basically identical in configuration, for example, to measurement apparatus 100 in the first embodiment. However, insulating substrate 21 in the present embodiment is for example larger than insulating substrate 21 in the first embodiment, and sized such that it can face a plurality of housing portions 17. Although not shown, insulating substrate 21 is almost equal in size to semiconductor test jig 12 for example as seen in plan view, and is sized such that it can face all of housing portions 17 (for example, sixteen housing portions 17 in FIG. 2) formed in semiconductor test jig 12.

Insulating substrate 21 of probe substrate 2 in the present embodiment is provided, in its each region facing corresponding one of housing portions 17 (semiconductor chips 10) during measurement, with contact probes 23 that are basically identical in arrangement and number to a set of contact probes 23 of probe substrate 2 in the first embodiment, and also with shield portions 22 that can be brought in proximity to frame portions 13, respectively. Insulating substrate 21 can be disposed so as to face the main surface of semiconductor test jig 12 directly above semiconductor test jig 12 (housing portion 17) as in the first embodiment.

Shield portion 22 is formed such that it is connected to one end and the other end in the horizontal direction in which insulating substrate 21 extends (to near the outer periphery of insulating substrate 21 including these ends as seen in plan view), and such that it can face corresponding one of frame portions 13. Specifically, a plurality of sets of contact probes 23 are formed in insulating substrate 21 of probe substrate 2 in the present embodiment so as to face a plurality of housing portions 17, respectively. In other words, a set of contact probes 23 is provided for each of semiconductor chips 10 placed in the plurality of housing portions 17 such that a plurality of sets of contact probes 23 are simultaneously connected to these semiconductor chips 10, respectively.

Figure 21:
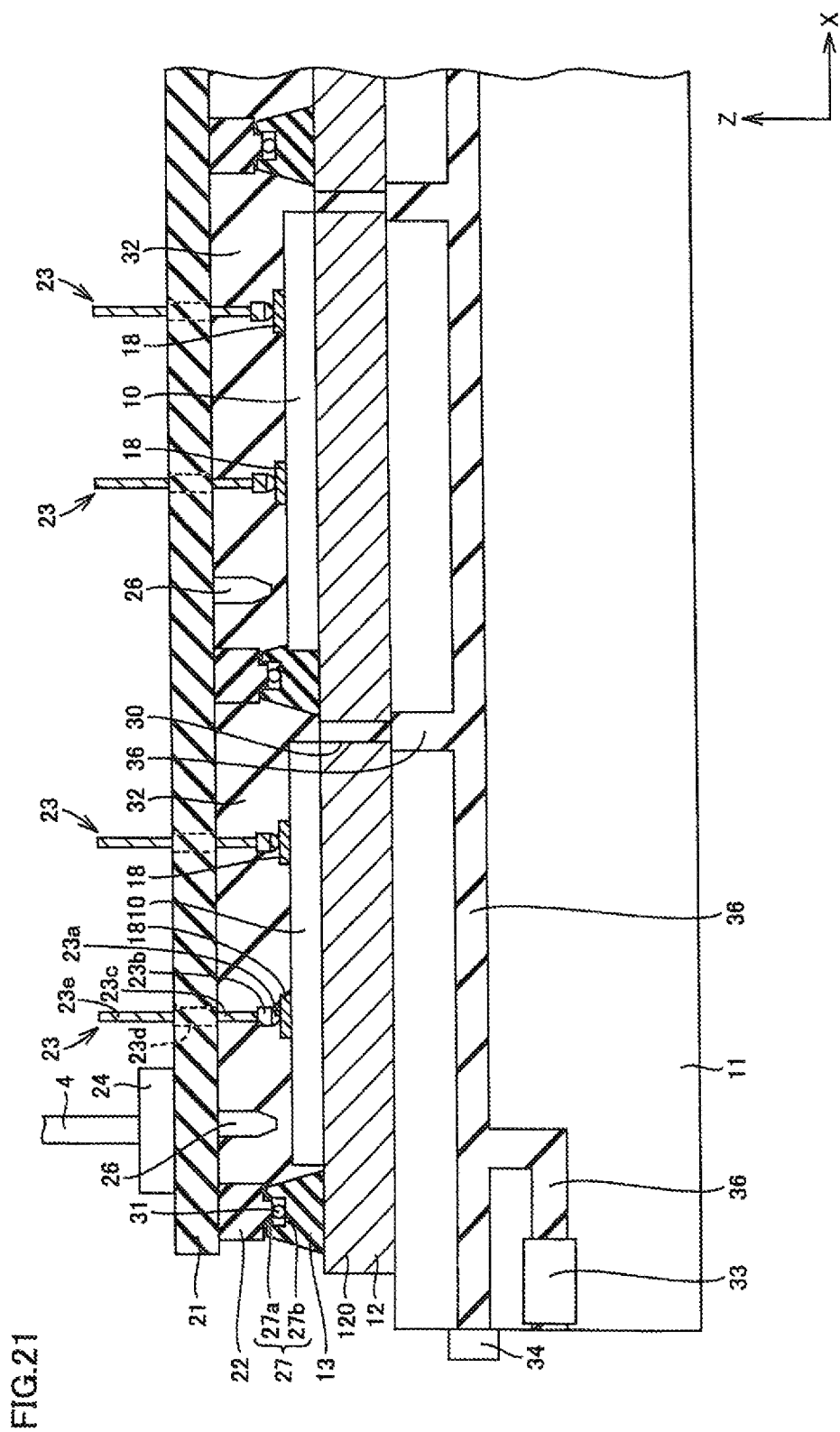
FIG. 21 is a schematic cross-sectional view showing the enlarged first example of the state of a P5 portion in FIG. 20 in the case where a semiconductor chip is measured using the semiconductor evaluation apparatus in FIG. 20.
Figure 22:
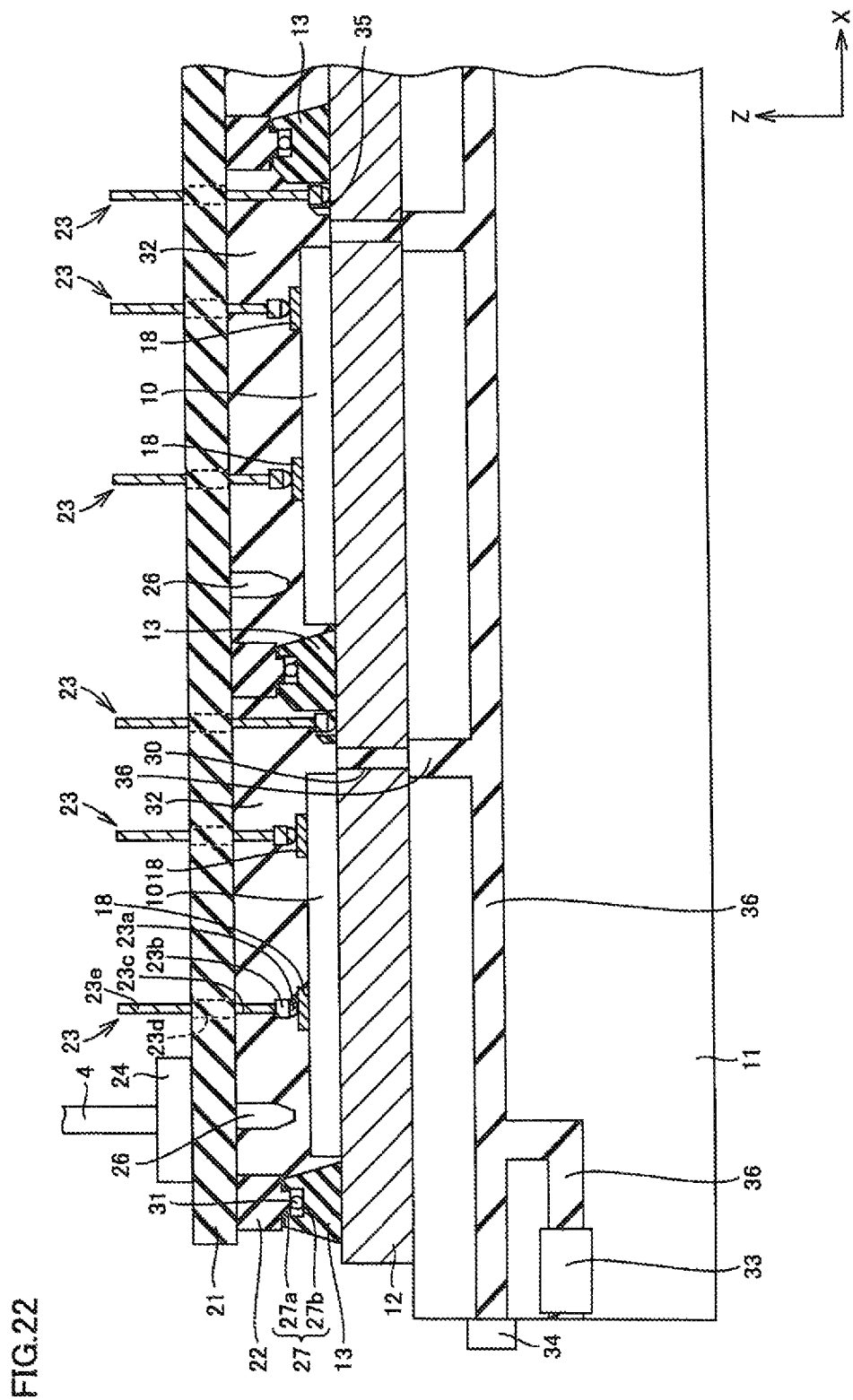
FIG. 22 is a schematic cross-sectional view showing the enlarged second example of the state of the P5 portion in FIG. 20 in the case where a semiconductor chip is measured using the semiconductor evaluation apparatus in FIG. 20.

Referring to FIGS. 21 and 22, frame portion 13 surrounding corresponding one of a plurality of housing portions 17 and shield portion 22 are brought in proximity to each other (brought into contact with each other by seal member 31, for example) during measurement of semiconductor chip 10, thereby providing space 32 between each housing portion 17 and probe substrate 2 facing thereto. In other words, each of the plurality of housing portions 17 is surrounded by frame portion 13, insulating substrate 21 and shield portion 22, thereby providing a configuration in which space 32 can be provided in each of housing portions 17. Accordingly, it becomes possible to simultaneously measure the semiconductor elements in the plurality of semiconductor chips 10 each placed in corresponding one of housing portions 17.

Again referring to FIG. 21, at least one vent 30 is formed in each housing portion 17 of semiconductor test jig 12 in the present embodiment. This vent 30 is formed so as to extend from the surface of housing portion 17 on which semiconductor chip 10 is placed, through pedestal 120 in the up-down direction in FIG. 21, and reach the lowest surface of pedestal 120 (the plane coming in contact with the upper surface of chuck stage 11 on which semiconductor test jig 12 is placed). It is preferable that vent 30 is provided near the edge of housing portion 17 so as not to be covered by semiconductor chip 10 when semiconductor chip 10 is placed on housing portion 17. In this way, it becomes possible to suppress a decrease in the deaeration effect by vent 30 that is caused by blocking of vent 30 by semiconductor chip 10.

A flow path 36 is formed on the upper surface of chuck stage 11 so as to overlap with (so as to be in communication with) each of vents 30, as seen in plan view, in housing portions 17 of semiconductor test jig 12 fixed on this upper surface. As with vent 30, this flow path 36 is to cause the fluid within space 32 to be discharged to the outside. Flow paths 36 respectively leading to vents 30 extending from the plurality of housing portions 17 are coupled to one another so as to form a trunk line-type flow path below the chuck stage, thereby forming a single flow path 36 on the downstream side (at the time when a fluid is discharged) of flow paths 36. Furthermore, as with vent 30 in the second embodiment, constant-pressure valve 33 and opening and closing means 34 are installed on the most downstream portion (at the time when a fluid is discharged) of flow paths 36.

In the present embodiment, deaeration at the time when supplying a fluid into space 32 using fluid spraying means 26 is carried out through vent 30 provided in housing portion 17 of semiconductor test jig 12 and flow path 36 formed in chuck stage 11. The same mechanism in the second embodiment is employed for discharging the fluid within space 32 through vent 30 and flow path 36, and adjusting the pressure within space 32 by constant-pressure valve 33 and opening and closing means 34. Therefore, the present embodiment also achieves the effect of suppressing occurrence of partial discharge by adjusting the pressure within space 32, as in the second embodiment.

Again referring to FIG. 22, although the configuration is basically similar to that in FIG. 21 in this case, frame portion 13 is provided with opening 35, through which the backside electrode is taken out to the surface side, as in the third embodiment.

In addition, since the configuration of the present embodiment other than those described above is almost the same as the configuration of the first embodiment, the same components are designated by the same reference characters, and description thereof will not be repeated.

In the present embodiment, since the elements of semiconductor chips 10 placed on a plurality of housing portions 17, respectively, can be simultaneously measured, the measurement operation can be carried out in a shorter time than that in the first embodiment. Accordingly, the efficiency of the measurement operation can be further improved as compared with the first embodiment.

In addition, in order to simultaneously evaluate a plurality of semiconductor chips 10, measurement apparatus 200 includes a single probe substrate 2 sized such that it can face a plurality of semiconductor chips 10, but the configuration is not limited thereto. For example, also by employing a measurement apparatus provided with a plurality of probe substrates 2 (each sized such that it can face only one semiconductor chip 10) as in the first embodiment, a plurality of semiconductor chips 10 can be collectively evaluated as in the present embodiment.

Each embodiment described above and each example described in each embodiment can be combined as appropriate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor evaluation apparatus using a contact probe to measure electrical characteristics of an element formed in each of a plurality of semiconductor devices, said semiconductor evaluation apparatus comprising:

a jig for evaluation provided such that said plurality of semiconductor devices can be placed thereon; and a probe substrate provided so as to face said jig for evaluation, and including said contact probe, a shield portion capable of shielding said element against an electric field produced by a current flowing through said contact probe, and an insulating substrate holding said contact probe, said jig for evaluation including a frame portion that surrounds each of said plurality of semiconductor devices, said frame portion forming a plurality of housing portions such that said plurality of semiconductor devices can be separately placed on said plurality of housing portions, respectively, and said semiconductor evaluation apparatus being configured to bring said contact probe into contact with said element formed in a first semiconductor device of said plurality of semiconductor devices, said first semiconductor device being placed on a first housing portion of said plurality of housing portions in a space between said frame portion and said probe substrate, said space being sealed by a connection, said connection being between said shield portion and said frame portion that surrounds said first semiconductor device such that said first semiconductor device is electrically separated from each other semiconductor device of said plurality of semiconductor devices.

2. The semiconductor evaluation apparatus according to claim 1, wherein
said probe substrate is capable of measuring said element in a state where said probe substrate faces only said first housing portion and said space is provided between said probe substrate and said first housing portion, said semiconductor evaluation apparatus further comprising:
a moving member capable of moving with respect to said jig for evaluation within a region in which said moving member faces said jig for evaluation such that said probe substrate can be placed at a position where said probe substrate faces said first housing portion or a position where said probe substrate faces a second housing portion of said plurality of housing portions that is different from said first housing portion.

3. The semiconductor evaluation apparatus according to claim 1, wherein said probe substrate is provided with a plurality of sets of said contact probes so as to face said plurality of housing portions, respectively.

4. The semiconductor evaluation apparatus according to claim 3, further comprising a chuck stage on which said jig for evaluation is placed, wherein
at least one vent is provided in each of said plurality of housing portions of said jig for evaluation, and
said chuck stage is provided with a flow path leading to each said vent.

5. The semiconductor evaluation apparatus according to claim 1, wherein said probe substrate includes said shield portion and said insulating substrate that are separately provided.

6. The semiconductor evaluation apparatus according to claim 1, wherein said probe substrate includes said shield portion and said insulating substrate that are integrally provided.

7. The semiconductor evaluation apparatus according to claim 1, wherein
said probe substrate is shaped to include a horizontal component extending along a main surface of each of said housing portions and a first vertical component extending in a direction perpendicular to the main surface of each of said housing portions,
said frame portion is shaped to include a second vertical component extending in the direction perpendicular to the main surface of each of said housing portions, and
said connection includes said first vertical component of said probe substrate and said second vertical component of said frame portion being brought in proximity to each other.

8. The semiconductor evaluation apparatus according to claim 7, wherein
said connection includes said first vertical component of said probe substrate and said second vertical component of said frame portion being brought into contact with each other, and
a seal member is sandwiched between said first vertical component of said probe substrate and said second vertical component of said frame portion, to provide said space.

9. The semiconductor evaluation apparatus according to claim 7, wherein fluid spraying means capable of supplying a fluid to said space is attached to said horizontal component of said probe substrate and/or attached to said first vertical component of said probe substrate.

10. The semiconductor evaluation apparatus according to claim 9, wherein said fluid spraying means includes temperature adjustment means for adjusting a temperature of a fluid discharged from said fluid spraying means.

11. The semiconductor evaluation apparatus according to claim 10, wherein said temperature adjustment means adjusts the temperature of the fluid discharged from said fluid spraying means such that a difference between the temperature of the fluid discharged from said fluid spraying means and a temperature of said semiconductor device is equal to or lower than 3 degrees.

* * * * *